US011146893B2

United States Patent
Drljaca

(10) Patent No.: US 11,146,893 B2
(45) Date of Patent: Oct. 12, 2021

(54) SENSOR SYSTEM, SENSOR ARRANGEMENT, AND ASSEMBLY METHOD USING SOLDER FOR SEALING

(71) Applicant: MEAS Switzerland S.a.r.l., Bevaix (CH)

(72) Inventor: Predrag Drljaca, Neuchatel (CH)

(73) Assignee: TE CONNECTIVITY SOLUTIONS GMBH, Steinach (CH)

( * ) Notice: Subject to any disclaimer, the term of this patent is extended or adjusted under 35 U.S.C. 154(b) by 0 days.

(21) Appl. No.: 16/133,122

(22) Filed: Sep. 17, 2018

(65) Prior Publication Data

US 2019/0090065 A1 Mar. 21, 2019

(30) Foreign Application Priority Data

Sep. 15, 2017 (EP) .................................. 17191236

(51) Int. Cl.
*H04R 25/00* (2006.01)
*H04R 19/00* (2006.01)
(Continued)

(52) U.S. Cl.
CPC .......... *H04R 19/00* (2013.01); *B81C 1/0023* (2013.01); *B81C 1/00309* (2013.01); *H04R 1/06* (2013.01);
(Continued)

(58) Field of Classification Search
CPC .... B81B 2201/0214; B81B 2201/0257; B81B 2201/0264; B81B 2207/012;
(Continued)

(56) References Cited

U.S. PATENT DOCUMENTS

| 2006/0157841 | A1 | 7/2006 | Minervini |
| 2008/0044043 | A1* | 2/2008 | Yonehara ............... H04R 19/04 381/174 |
| 2010/0111344 | A1 | 5/2010 | Sun et al. |

FOREIGN PATENT DOCUMENTS

| DE | 10303263 A1 | 8/2004 |
| EP | 1755360 A1 | 2/2007 |

OTHER PUBLICATIONS

European Search Report, dated Aug. 5, 2018, 8 pages.
Abstract of DE10303263, dated Aug. 5, 2018, 2 pages.
EPC Communication, dated Feb. 3, 2020, 7 pages.

* cited by examiner

*Primary Examiner* — Phylesha Dabney

(57) ABSTRACT

The present invention relates to a sensor arrangement, to a corresponding method of assembling such a sensor arrangement, and to a sensor system. The sensor arrangement comprises at least one transducer element for monitoring at least one measurand and generating an electrical output signal correlated with the at least one measurand; and a sensor substrate comprising the transducer element. The sensor substrate is mountable on a circuit carrier in a way that a media channel penetrating the circuit carrier allows access of the at least one measurand to the transducer element. The circuit carrier has an electrically conductive solderable first sealing pattern which surrounds the media channel at least partly and which is aligned with a solderable second sealing pattern arranged on the sensor substrate, so that a soldered sealing connection, which at least partly surrounds the media channel, is formed between the first sealing pattern and the second sealing pattern.

13 Claims, 20 Drawing Sheets

(51) Int. Cl.
*B81C 1/00* (2006.01)
*H04R 1/06* (2006.01)
*H04R 31/00* (2006.01)
*H05K 1/18* (2006.01)

(52) U.S. Cl.
CPC ........... *H04R 31/006* (2013.01); *H05K 1/181* (2013.01); *B81B 2201/0214* (2013.01); *B81B 2201/0257* (2013.01); *B81B 2201/0264* (2013.01); *B81B 2207/012* (2013.01); *B81C 2203/019* (2013.01); *B81C 2203/035* (2013.01); *H04R 2499/10* (2013.01); *H05K 2201/10151* (2013.01); *H05K 2203/1147* (2013.01)

(58) Field of Classification Search
CPC .............. B81C 1/0023; B81C 1/00309; B81C 2203/019; B81C 2203/035; H04R 19/00; H04R 1/06; H04R 2499/10; H04R 31/006; H05K 1/181; H05K 2201/10151; H05K 2203/1147
USPC ........................................................ 381/150
See application file for complete search history.

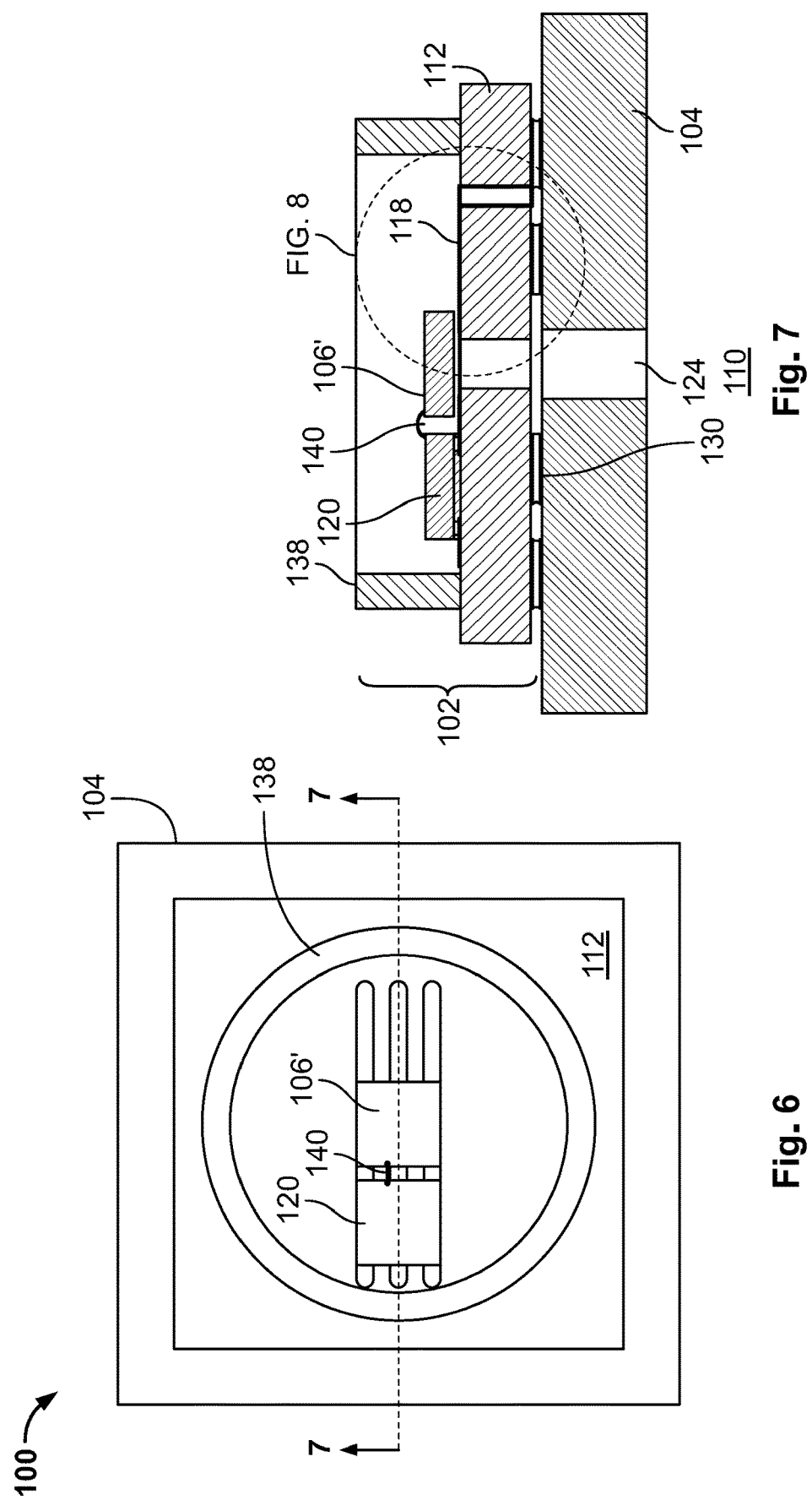

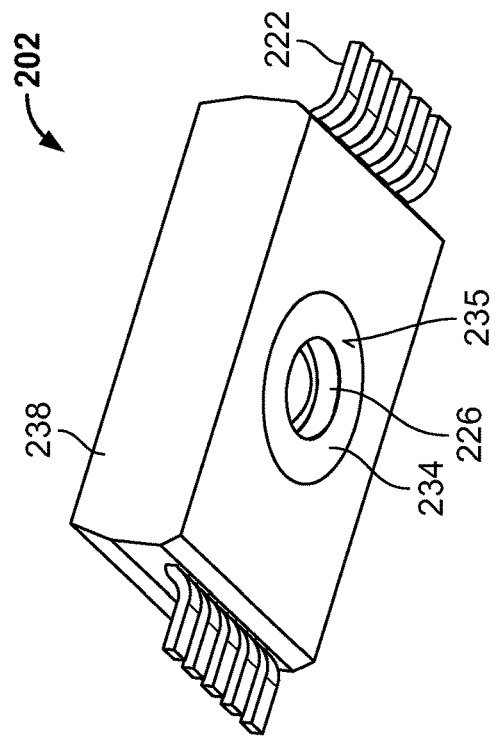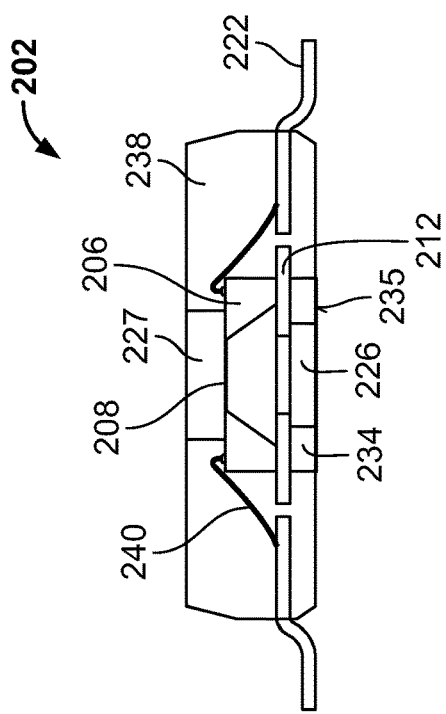

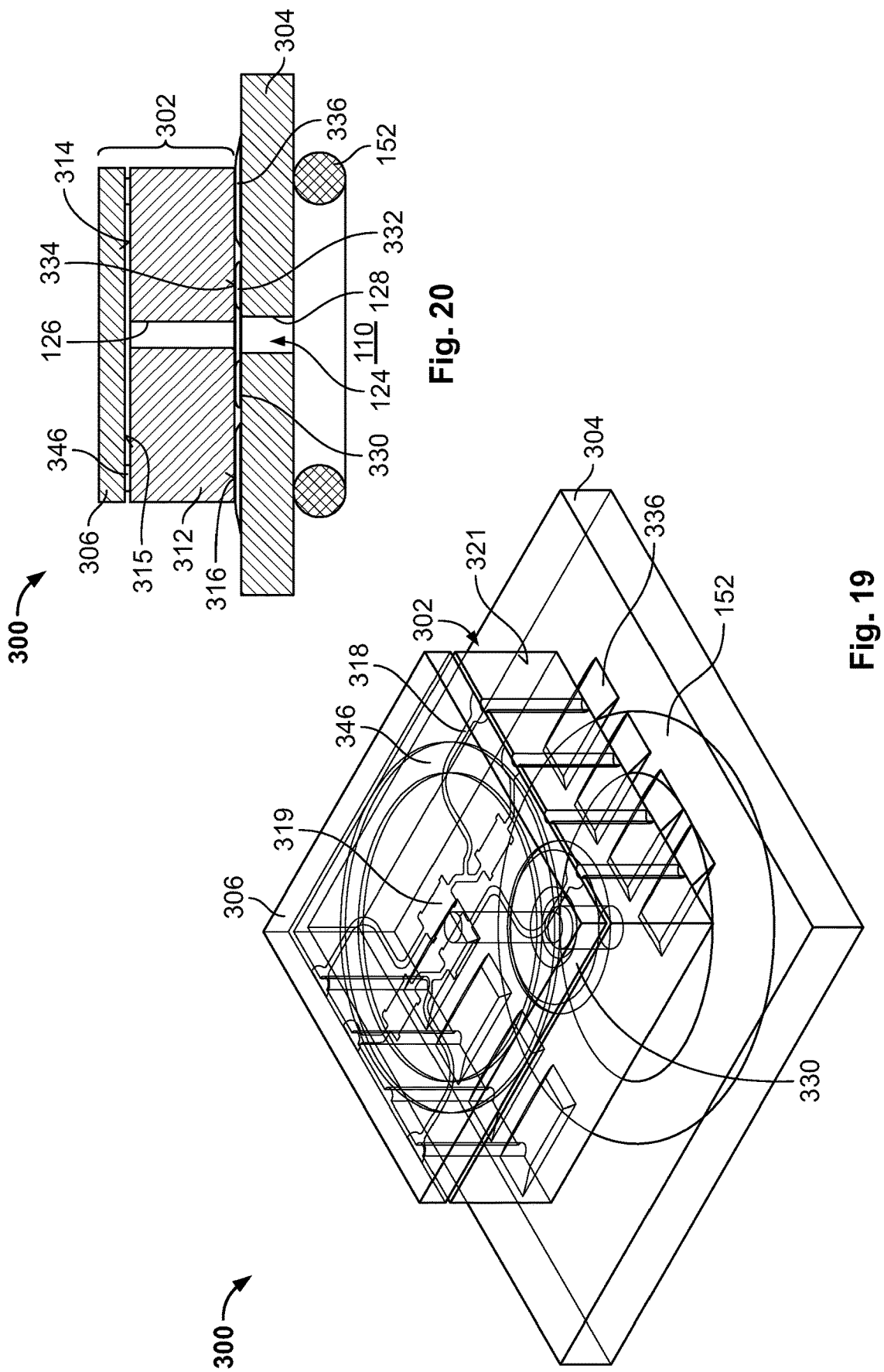

SENSOR SYSTEM, SENSOR ARRANGEMENT, AND ASSEMBLY METHOD USING SOLDER FOR SEALING

CROSS-REFERENCE TO RELATED APPLICATIONS

This application claims the benefit of the filing date under 35 U.S.C. § 119(a)-(d) of European Application No. 17191236.3 filed Sep. 15, 2017.

FIELD OF THE INVENTION

The present invention relates to a sensor arrangement having at least one transducer element for monitoring at least one measurand and for generating an electrical output signal correlated with the at least one measurand. The present invention further relates to a corresponding method of assembling such a sensor arrangement, and to a sensor system.

BACKGROUND

In particular for automotive applications, a plurality of measurands is to be monitored, physical ones such as pressure or temperature as well as electrochemical ones such as gas concentrations (e.g. $CO_2$). In any case, the medium which is to be monitored has to gain access to defined sensitive elements of the sensor arrangement while it has to be ensured on the other hand that the aggressive and humid environment does not damage and/or impair the remaining parts, in particular the electronic components of the sensor arrangement. Furthermore, a trend in automotive industry is that component suppliers provide sensor components in a not yet fully assembled state to the original equipment manufacturers (OEM), so that providing a sealing that protects the electronic components has to be facilitated and be capable of being automated and part of an assembly procedure performed outside the premises of the component supplier.

An object underlying the present invention, among other objects, is to provide a sensor arrangement and a corresponding assembly method improving performance and reliability of the sensor arrangement, thereby overcoming, or at least substantially reducing the above mentioned problems and drawbacks.

SUMMARY

In particular, the present invention provides a sensor arrangement having at least one transducer element for monitoring at least one measurand and generating an electrical output signal correlated with the at least one measurand, and a sensor substrate having the transducer element. The sensor substrate can be mounted on a circuit carrier in a way that a media channel penetrating the circuit carrier allows access of the at least one measurand to the transducer element, wherein the circuit carrier has an electrically conductive solderable first sealing pattern which surrounds the media channel at least partly and which is aligned with a solderable second sealing pattern arranged on the sensor substrate, so that a soldered sealing connection, which at least partly surrounds the media channel, is formed between the first sealing pattern and the second sealing pattern.

The present invention further relates to a method of assembling a sensor system, the method having the following steps:

providing at least one transducer element, which is operable to monitor at least one measurand and to generate an electrical output signal correlated with the at least one measurand, wherein
(a) the transducer element forms a sensor substrate, or
(b) wherein the sensor substrate is mounted on a first surface of a sensor substrate, which has at least one first opening through which the measurand has access to the transducer element;

providing a circuit carrier for mounting the sensor substrate, the circuit carrier having at least one second opening and an electrically conductive solderable first sealing pattern which surrounds the at least one second opening at least partly;

aligning the circuit carrier with the sensor substrate in a way that access of the at least one measurand to the transducer element is allowed through a media channel penetrating the circuit carrier and being formed of at least the second opening, and that the electrically conductive solderable first sealing pattern is aligned with a solderable second sealing pattern arranged on the sensor substrate;

performing a soldering step so that a soldered sealing connection, which at least partly surrounds the media channel, is formed between the first sealing pattern and the second sealing pattern.

BRIEF DESCRIPTION OF THE DRAWINGS

The invention will be described with reference to the accompanying drawings of which:

FIG. 6 is a top view of the sensor arrangement according to FIG. 5;

FIG. 7 is a sectional view of the sensor arrangement according to FIG. 5 along the cut line shown in FIG. 6;

FIG. 16 is a sectional view of a sensor arrangement according to a further embodiment of the present invention;

FIG. 17 is a perspective view of the sensor arrangement according to FIG. 16;

FIG. 18 is a further perspective view of the sensor arrangement according to FIG. 16;

FIG. 19 is a perspective view of a sensor arrangement according to a further embodiment of the present invention;

FIG. 20 is a sectional view of the sensor arrangement according to FIG. 19 along the cut line shown in FIG. 22;

DETAILED DESCRIPTION OF THE EMBODIMENT(S)

These drawings, together with the description serve to explain the principles of the invention. The drawings are merely for the purpose of illustrating the preferred and alternative examples of how the invention can be made and used, and are not to be construed as limiting the invention to only the illustrated and described embodiments. Furthermore, several aspects of the embodiments may form—individually or in different combinations—solutions according to the present invention. The following described embodiments thus can be considered either alone or in an arbitrary combination thereof.

The present invention is based on the idea that by using a solderable material as a sealing means for sealing sensitive areas (including the electronics) against the ingress of humidity and aggressive chemicals this sealing can be put in place in one step with assembling other solder connections, in particular the electric connection between the electronic components of the sensor arrangement and a circuit carrier to which the sensor arrangement is mounted. Soldered metal alloys have proven to be highly inert and corrosion resistant and effectively seal interfaces between adjoining surfaces because they form gas tight interconnections even in narrow crevices due to assuming a liquid phase during the manufacturing process.

In the context of the present invention, the term "circuit carrier" is intended to encompass any sort of substrate having electrically conductive leads on which a sensor arrangement (and optionally further electronic components) can be mounted. In particular, the circuit carrier may comprise a printed circuit board (PCB), a flexible circuit carrier (also called flexible printed circuit, FPC), a flex-rigid carrier (which is a combination of an FPC or a flat flexible cable with rigid elements), a ceramic substrate (thick film, LTCC, HTCC), glass, or the like.

Figure 1:
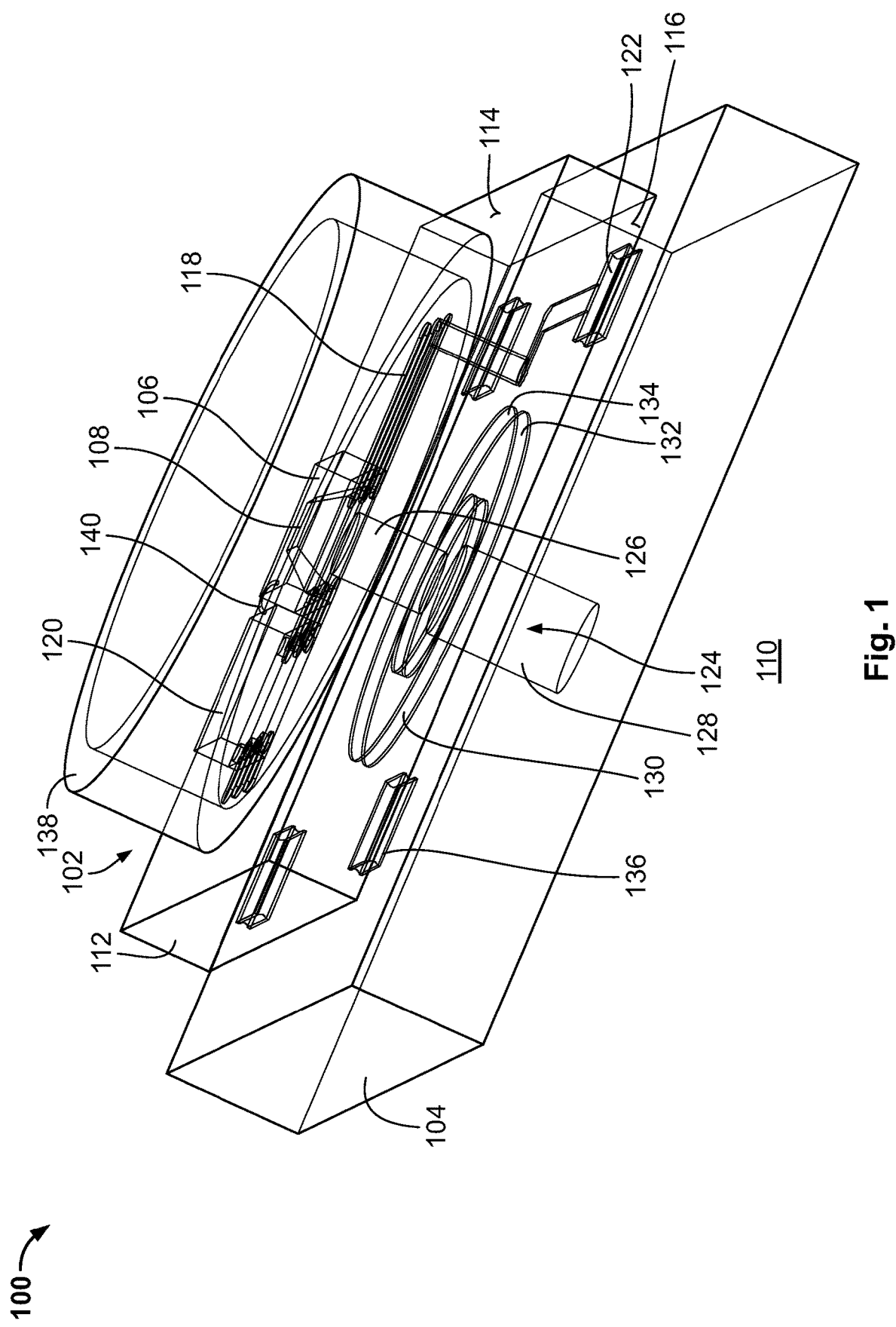
FIG. 1 is a perspective view of a sensor arrangement according to a first embodiment of the present invention.

The present invention will now be further explained referring to the Figures, and firstly referring to FIG. 1. FIG. 1 schematically illustrates in a schematic perspective view a sensor system 100 according to a first embodiment of the present invention. A sensor arrangement 102 is mounted on a circuit carrier 104. It has to be noted that the circuit carrier 104 is not part of the sensor arrangement 102 according to the present invention, but is part of the sensor system 100 together with the sensor arrangement 102. In the figures, the circuit carrier 104 is schematically depicted as a square piece of rigid material in order not to unnecessarily obscure the drawings. However, it is clear to a person skilled in the art that the shown circuit carrier 104 may in reality be only a small segment of a larger entity, for instance a printed circuit board (PCB) or a flexible board, having further electrical leads and electronic components mounted thereon.

The sensor arrangement 102 comprises a transducer element 106 which may for instance be a microelectromechanical (MEMS) pressure sensor. The transducer element 106 is mounted on a sensor substrate 112. The sensor substrate 112 has a first surface 114 on which the transducer element 106 is mounted. A second surface 116 which is opposite to the first surface 114 is facing towards the circuit carrier 104. The sensor substrate 112 comprises a plurality of electrically conductive leads 118 which are connected selectively to the transducer element 106 and to a further electronic component 120 such as signal processing circuitry and/or communication interfaces. However, it is clear to a person skilled in the art that the shown sensor substrate 112 may in reality further comprise other electrical components mounted thereon, together with an inside and/or outside protective cover 138 and may be electrically connected by means of wire bonding, bumping, soldering etc.

Furthermore, the transducer element 106 and the further electronic component 120 are electrically connected to each other by one or more electrically conductive leads 118 and/or a bond 140.

The electrically conductive leads 118 may be arranged on the first surface 114 and pass through the sensor substrate 112 to the second surface 116 being connected there to terminals 122. It has to be noted that only one electrically conductive lead 118 passing through the sensor substrate 112 is shown in the drawing for the sake of clarity.

As this is known in the art, such pressure sensors may have a silicon membrane 108 carrying for instance a piezoelectric strain gauge. The strain gauge detects the displacement of the membrane 108 due to a pressure difference between media acting on the two surfaces of the membrane. To this end, media being present in a measurement volume 110 need to have access to the membrane 108. This is ensured by a media channel 124 which is formed by a first opening 126 penetrating the sensor substrate 112 and a second opening 128 passing through the circuit carrier 104. The first and second openings 126, 128 are aligned concentrically to from a straight channel 124. The channel 124 does not necessarily have the same diameter along its longitudinal length.

In order to protect and optionally electrically screen the transducer element 106 and the electronic component 120, a protective cover 138 may be attached to the sensor substrate 112 so that it encompasses the transducer element 106, the electronic components 120, and the electrically conductive leads 118 as far as they are arranged on the first surface 114 of the sensor substrate 112. The protective cover 138 is fabricated from plastics, ceramics, glass, or an electrically conductive material, such as metal.

According to the present invention, the interface between the sensor substrate 112 and the circuit carrier 104 is sealed around the media channel 124 by means of a solder seal 130. According to certain embodiments of the present invention is formed by a ring-shaped solderable first sealing pattern 132 arranged on the circuit carrier 104 and a ring-shaped solderable second sealing pattern 134, both sealing patterns 132, 134 soldered together. In the shown embodiment, the sealing patterns 132, 134 have a circular form with essentially the same size and are aligned concentrically with respect to each other and to the media channel 124.

Of course, the sealing patterns 132, 134 do not necessarily have to be circular; they may have also polygonal or elliptic outlines. Moreover, they do not have to have an identical shape and size, and may also be aligned off-center, as long as they encompass the respective first and second openings 126, 128 for forming a soldered seal around these openings.

According to the present invention, the circuit carrier 104 comprises contact pads 136 which each form a solder connection to one of the terminals 122. The idea of the present invention allows to form the sealing connection between the first and second sealing patterns 132, 134 in the same processing step at which the terminals 122 are soldered to the contact pads 136. Thus, a processing step that has to be performed anyway when mounting the sensor substrate to a circuit carrier can additionally be used for establishing a secure sealing of the media channel 124, thereby protecting the electronic components 120 from any aggressive media present in the measurement volume 110. Advantageously, no further sealing materials, such as gaskets or resin, have to be procured.

The soldering step may be performed by a reflow soldering technique. In this case, the circuit carrier 104 is screen printed with a solderable precursor forming the contact pads 136 and the first sealing pattern 132. After the sensor arrangement 102 has been aligned on the circuit carrier 104, so that the solderable terminals 122 are positioned in contact with the contact pads 136 and the first and second sealing patterns 132, 134 are in contact with each other, the sensor system 100 is heated up until the precursor material reaches the liquidus state. After cooling down, the solder connections are established, forming the electrical connections as well as providing a secure sealing against the ingress of humidity and/or aggressive chemicals into the interface between the circuit carrier 104 and the sensor substrate 112.

Figure 2:
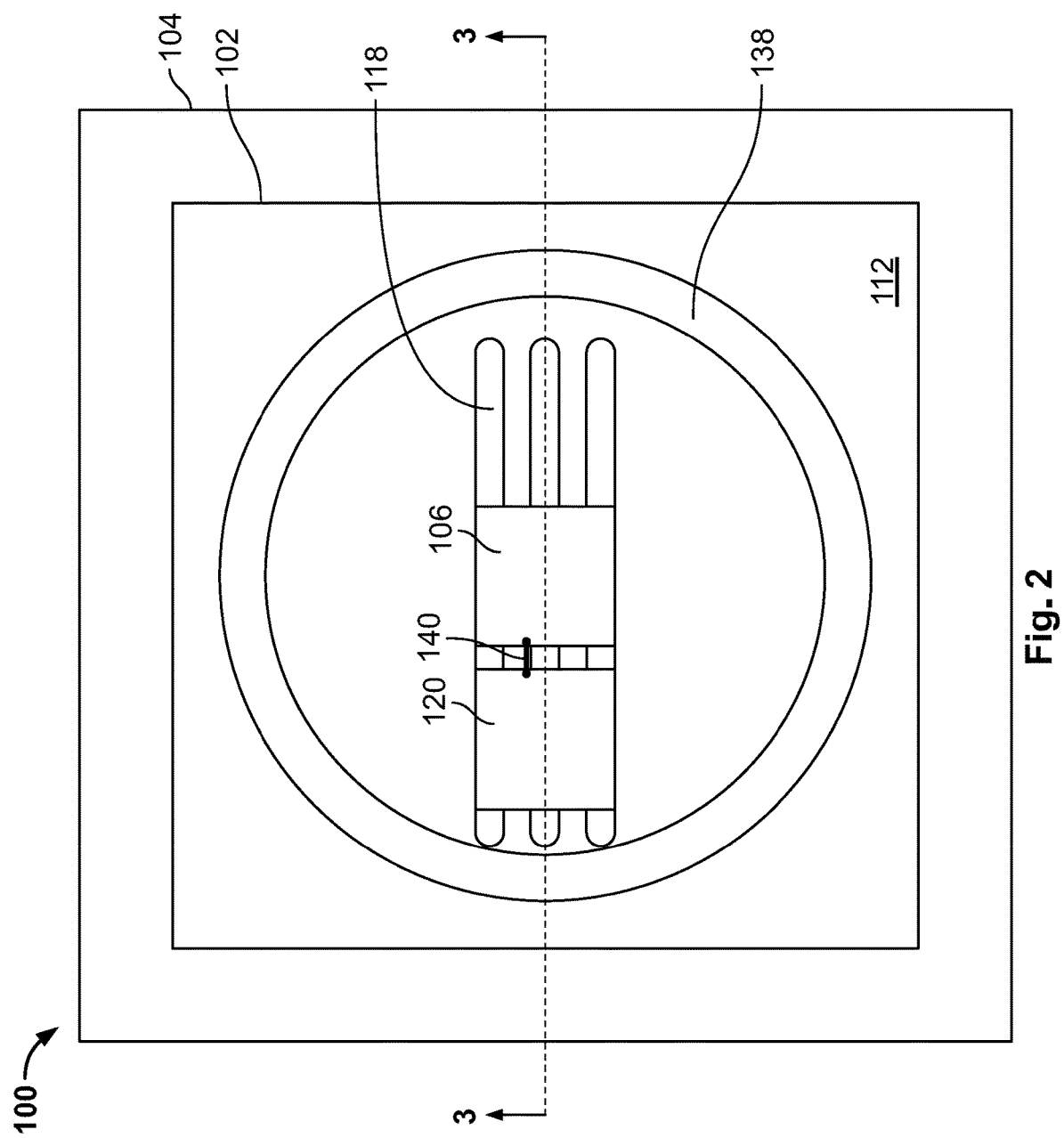
FIG. 2 is a top view of the sensor arrangement according to FIG. 1.

FIG. 2 shows a top view of the sensor system 100 explained with reference to FIG. 1. As already mentioned, the square dimensions of the circuit carrier 104 are only due to facilitating the graphic representation. Further, of course also more than one component 120 with electronic circuitry can be provided on the sensor substrate 112.

Figure 3:
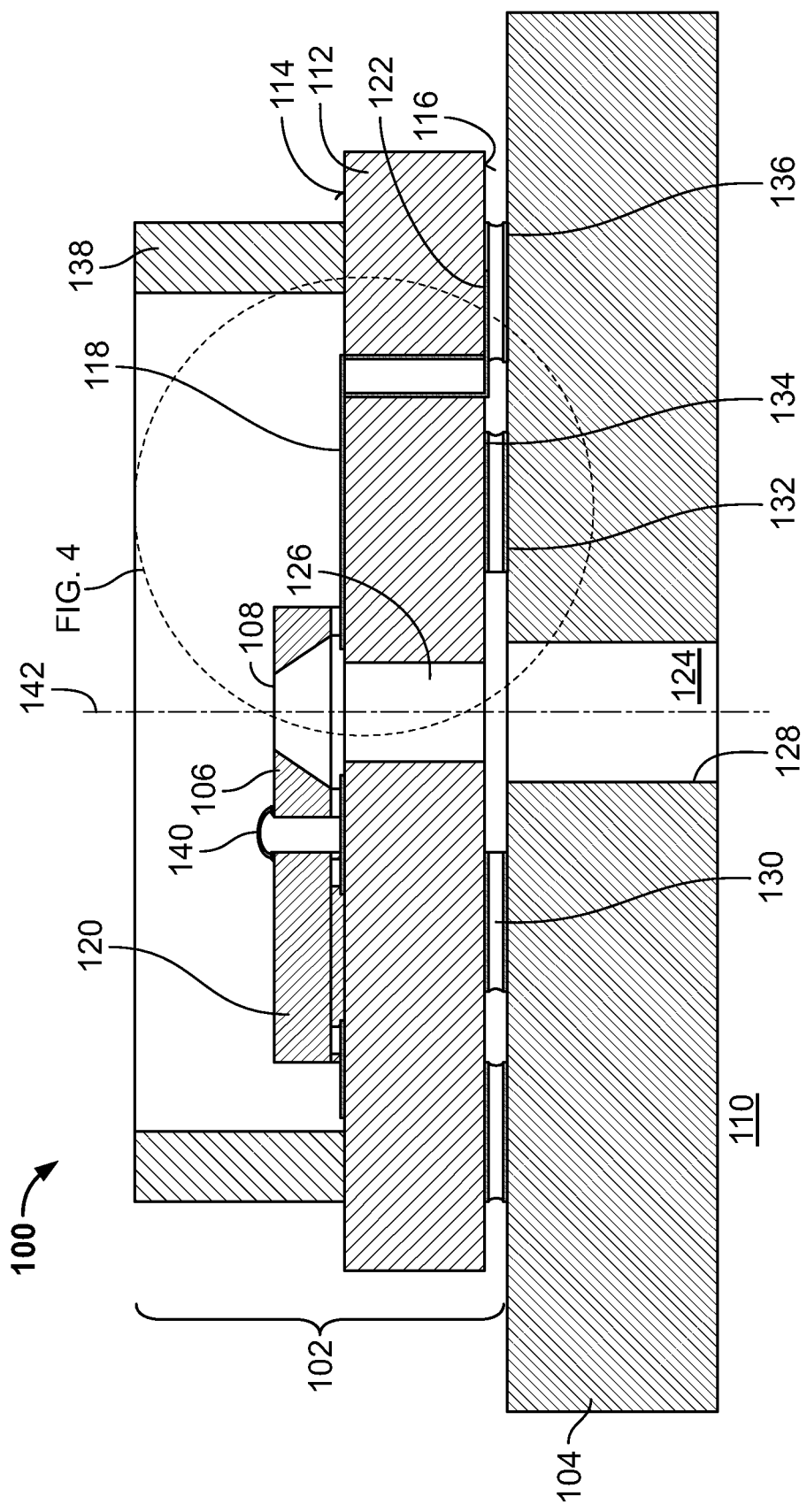
FIG. 3 is a sectional view of the sensor arrangement according to FIG. 1 along the cut line shown in FIG. 2.

FIG. 3 shows a sectional view along the cut lines III-III of FIG. 2. As can be seen from this Figure, the first opening 126 and the second opening 128 are concentrically aligned with respect to a central axis 142 in order to form a media channel 124 that leads from the measurement volume 110 into the transducer element 106 and fluidically connects the measurement volume 110 with the membrane 108. The ring-shaped solder seal 130 is arranged concentrically around the central axis 142. Thus, it surrounds the media channel 124 and seals the interface between the circuit carrier 104 and the sensor substrate 112 against the ingress of any substances present in the measurement volume 110. However, the two openings do not necessarily have to be concentric. If they have differing sizes, concentricity is not required, as long as a media channel with a sufficiently large diameter is formed. In fact, in practice there will be very small chance they are perfectly concentric, since the components 102 will always move on the substrate 104 during the soldering process.

Figure 4:
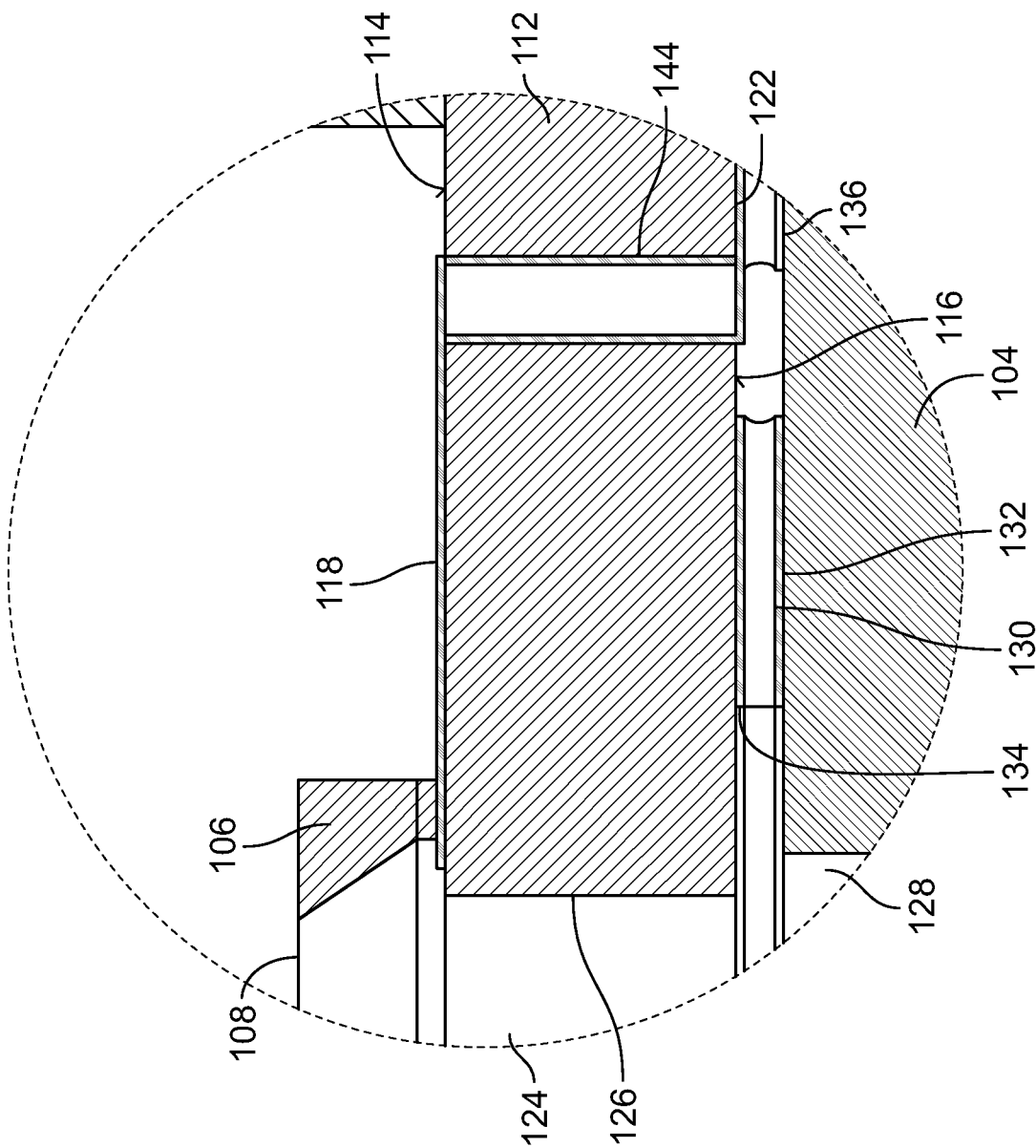
FIG. 4 is a detail of FIG. 3.
Figure 5:
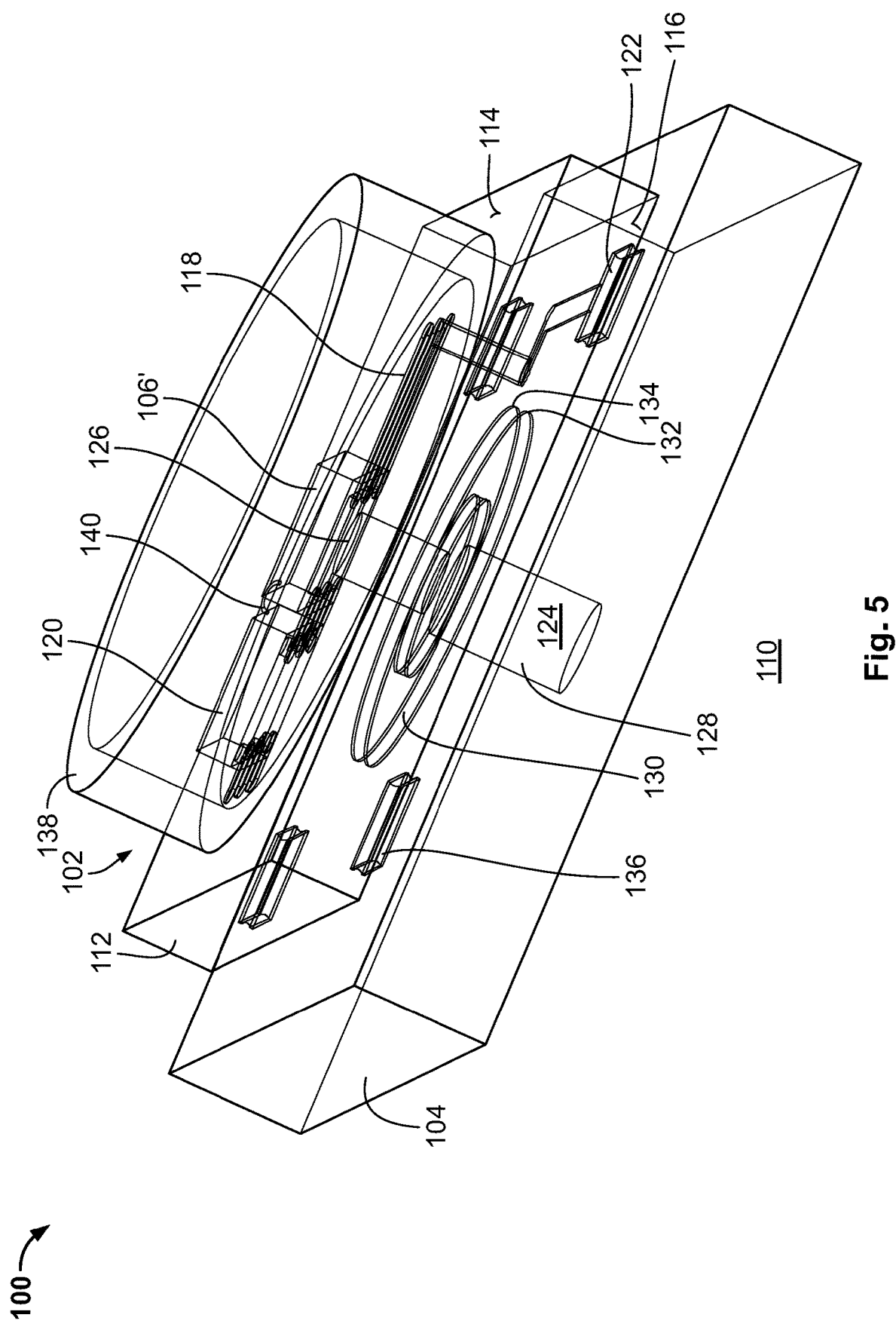
FIG. 5 is a perspective view of a sensor arrangement according to a further embodiment of the present invention.
Figure 8:
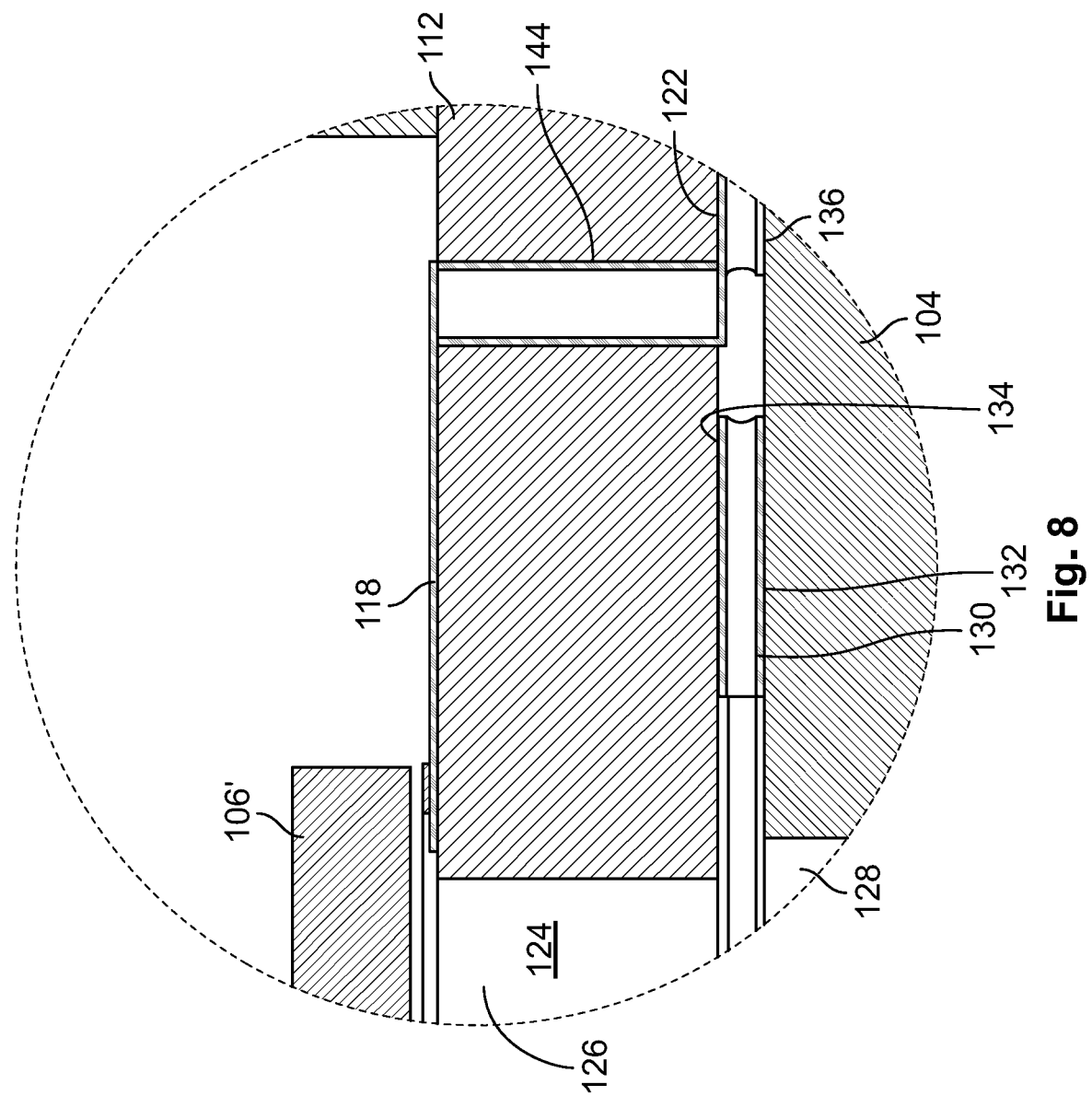
FIG. 8 is a detail of FIG. 7.
Figure 9:
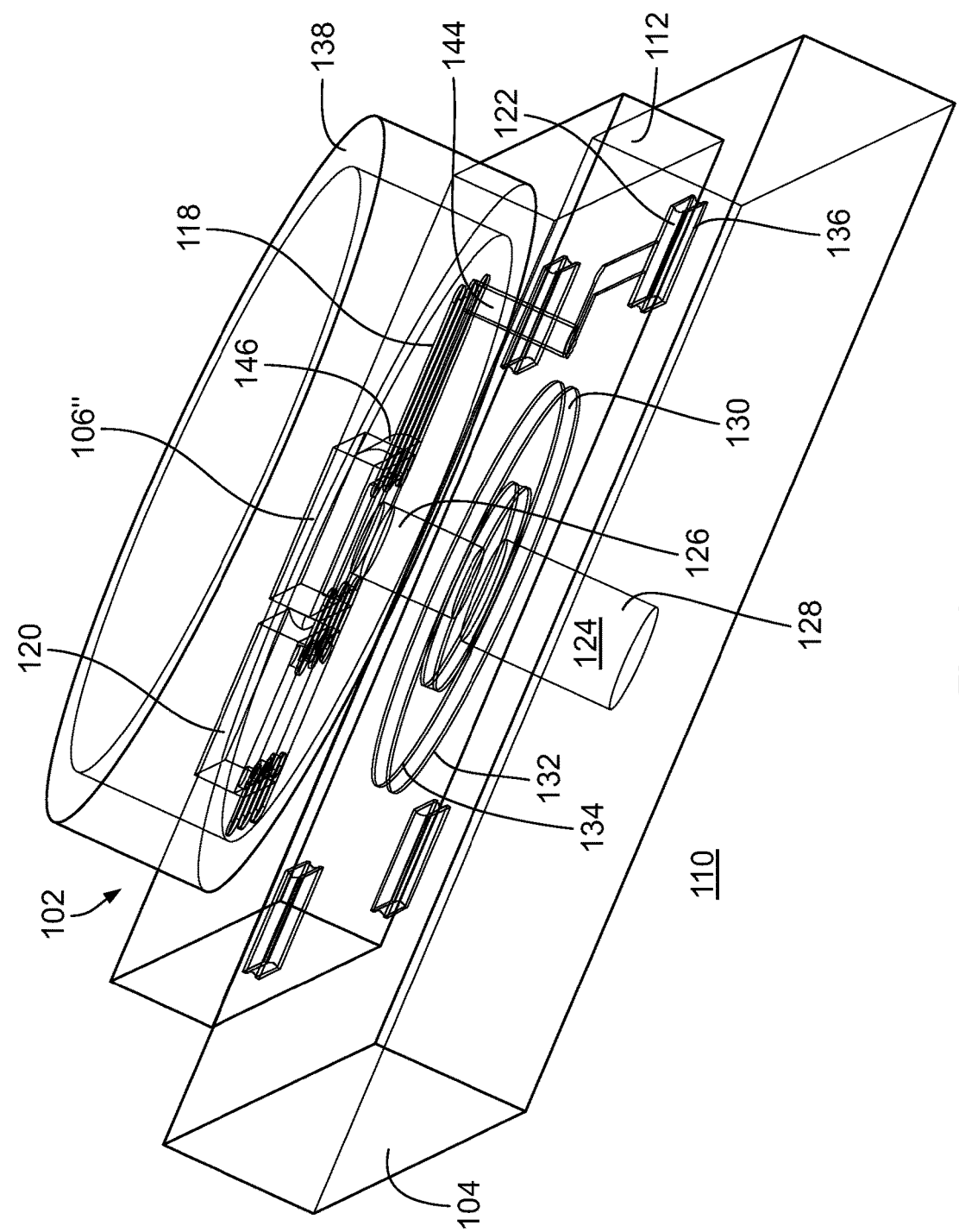
FIG. 9 is a perspective view of a sensor arrangement according to a further embodiment of the present invention.
Figure 10:
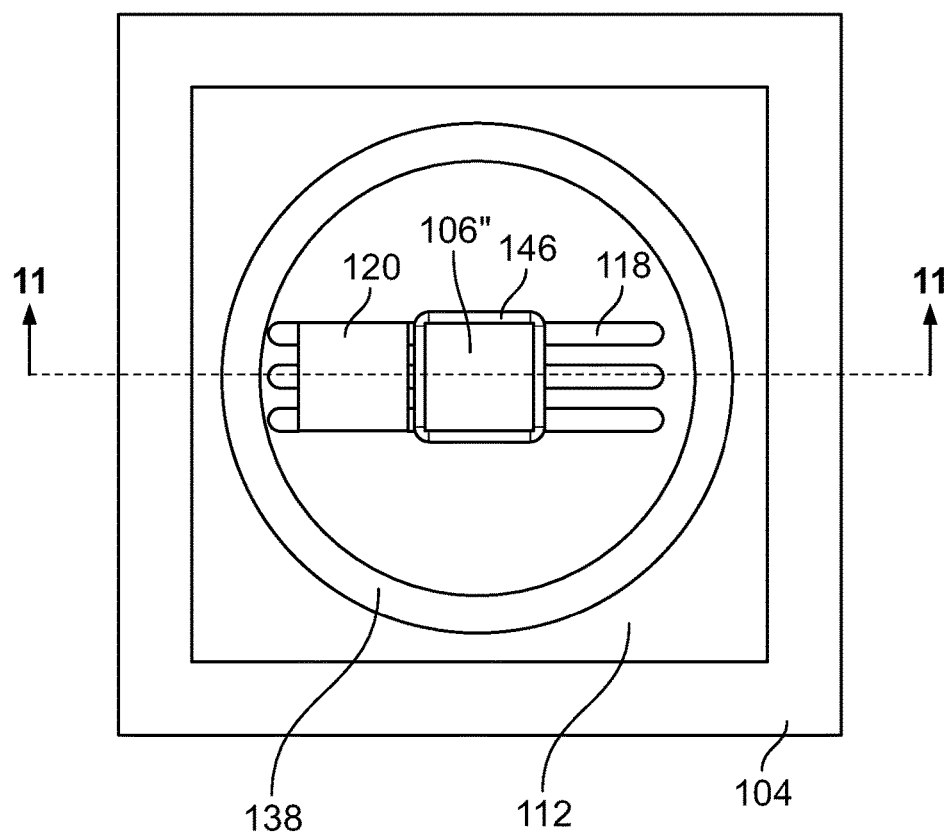
FIG. 10 is a top view of the sensor arrangement according to FIG. 9.
Figure 11:
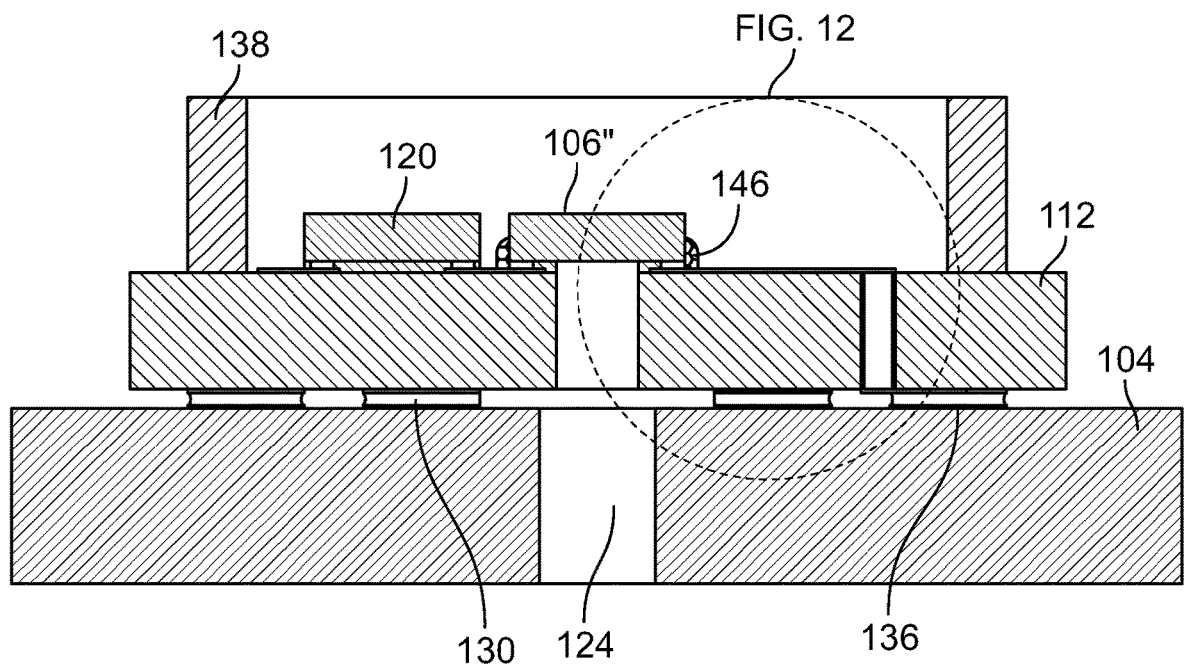
FIG. 11 is a sectional view of the sensor arrangement according to FIG. 9 along the cut line shown in FIG. 10.

In FIG. 4, a detail of FIG. 3 is shown. According to the present embodiment, the transducer element 106 is soldered to the electrically conductive leads 118. The lead is arranged in part on the first surface 114 of the sensor substrate 112, is connected through the sensor substrate 112 by means of a via 144 to a terminal 122, which is arranged on the second surface 116 of the sensor substrate 112.

The solder seal 130 is formed between the first and the second sealing pattern 132, 134. Thus the insurance of any aggressive chemicals and/or humidity towards the terminal 122 and the contact pads 136 can effectively be avoided.

As this is known to a person skilled in the art, there are different technologies of sensors that can be used for monitoring pressure. Moreover, the principles of the present invention are also applicable for any chemical sensors, such as $CO_2$ sensors, which have a sensitive layer arranged on an outer chip surface. The present invention is also applicable with any other kind of sensor, such as humidity sensors, force and acceleration sensors, flow sensors and the like. The present invention may also be used with optical sensors and light and sound emitting devices that are for instance used to measure liquid levels or other parameters of a liquid, such as the level and properties of a urea solution in an automobile.

FIGS. 5 to 8 illustrate such an alternative sensor system 100 having a transducer element 106' without a membrane as shown in the previous FIGS. 1 to 4. As can be seen from the details shown in FIG. 8, the transducer element 106' is not electrically connected to the electrically conductive leads 118. It is electrically connected only via the wire bonds (preferably more than one) 140.

All the other features remain unchanged and will not be re-iterated here.

The present invention further proposes an optional additional sealing means 146 that is arranged at the interface between the sensor substrate and the transducer element 106" and at least partly encompasses the transducer element 106". This improvement is shown in more detail in FIGS. 9 to 12.

Figure 12:
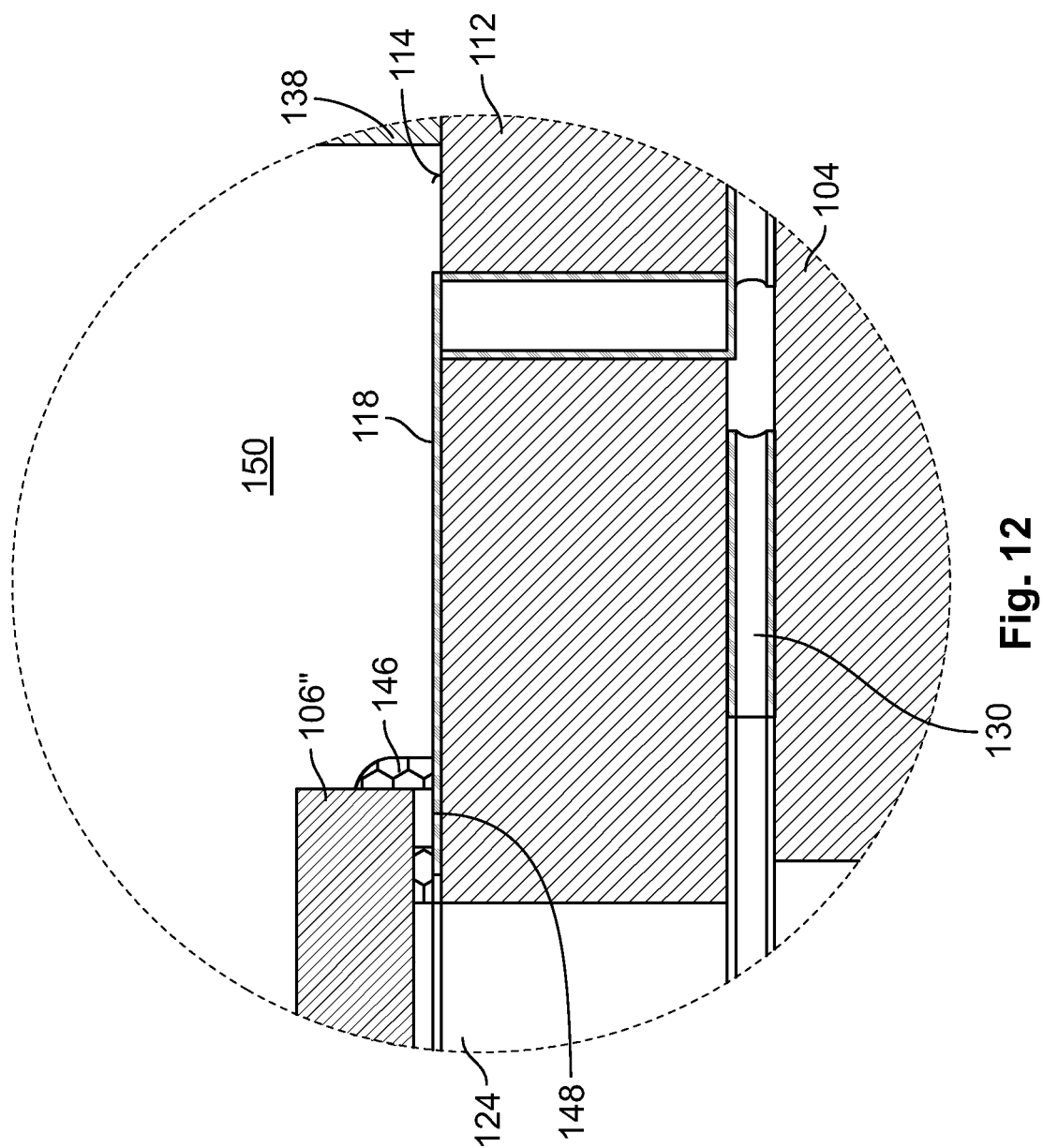
FIG. 12 is a detail of FIG. 11.

In particular when referring to FIG. 12, the inner seal 146 may for instance be formed from a silicon resin that is applied around the transducer element 106" after the electrical connection between the transducer element and the electrically conductive leads 118 has been established for instance by a solder connection 148. It is clear for a person skilled in the art, that the inner seal 146 may also be used with any of the previously shown arrangements of FIGS. 1 to 8. The inner seal effectively prevents any aggressive chemicals or humidity entering from the media channel 124 to get in contact with the upper surface 114 of the sensor substrate 112. Thus, corrosion and or contamination of the inner region 150 can effectively avoided.

Figure 13:
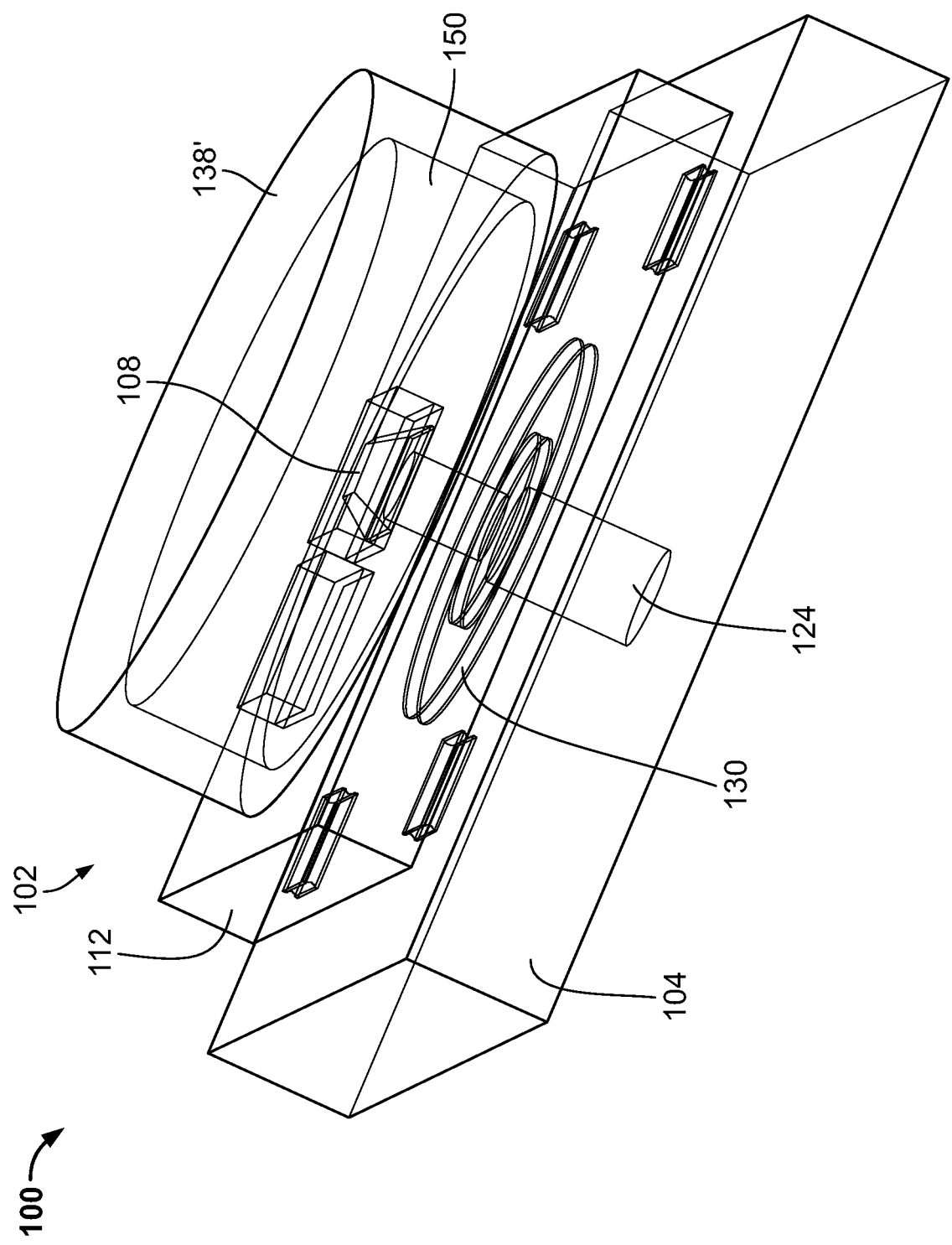
FIG. 13 is a perspective view of a sensor arrangement according to a further embodiment of the present invention.
Figure 14:
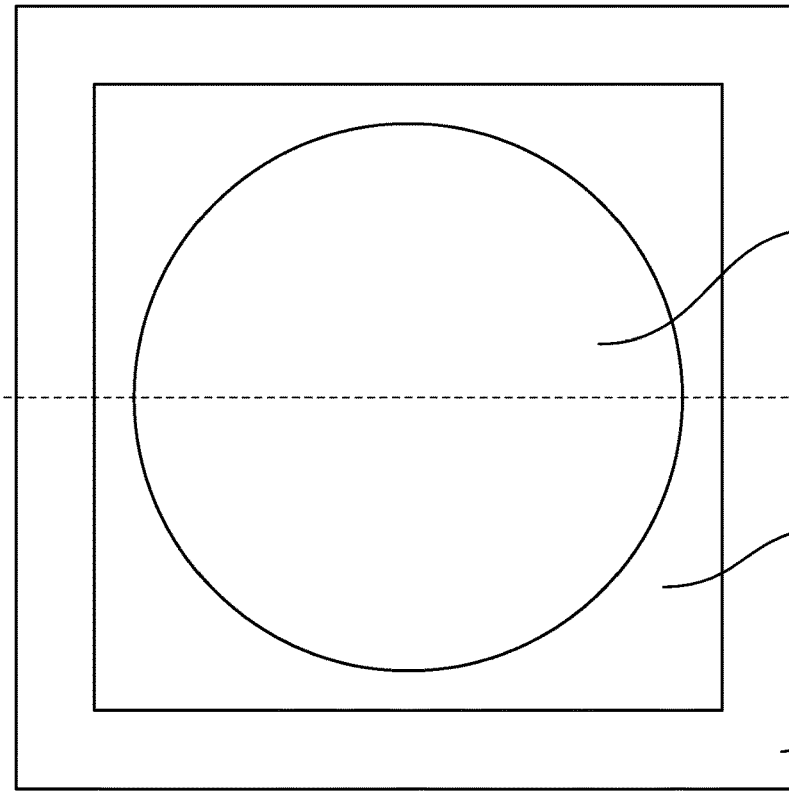
FIG. 14 is a top view of the sensor arrangement according to FIG. 13.
Figure 15:
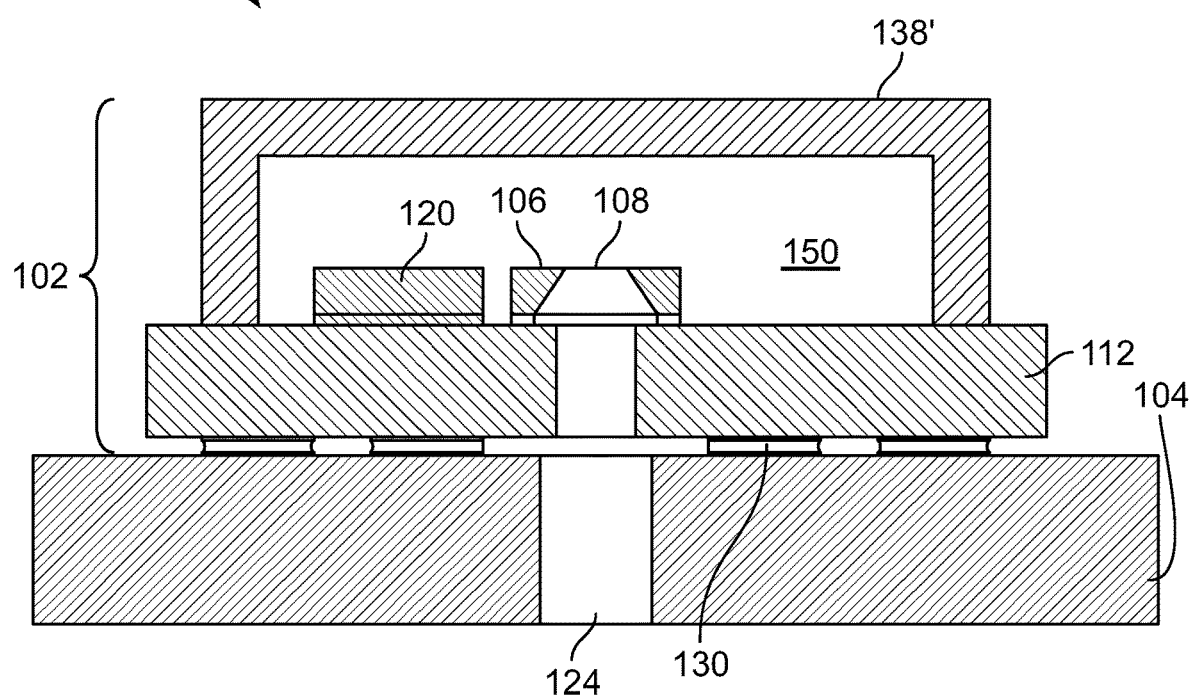
FIG. 15 is a sectional view of the sensor arrangement according to FIG. 13 along the cut line shown in FIG. 14.

FIGS. 1 to 12 showed a ring-shaped protective cover 138. However, also a closed lid 138' may be provided as the protective cover to completely close the inner region 150. FIGS. 13 to 15 illustrate this variant. All other features may be the same as explained with reference to FIGS. 1 to 12 and will therefore not be reiterated.

A further embodiment of a sensor arrangement 202 according to the present invention will now be explained with reference to FIGS. 16 to 18.

The sensor arrangement 202 comprises a transducer element 206 having a membrane 208. The membrane 208 is in contact to the media to be measured via the opening 226. Furthermore, a reference opening 227 allows the contact of the other side of the membrane 208 with a reference pressure. The transducer element 206 is attached to a leadframe 212 which function as a sensor substrate and also provides the connection to the circuit carrier (not shown in FIGS. 16 to 18), as this is generally known for this type of sensor package. Wire bonds 240 electrically connect the transducer element 206 to the terminals 222.

According to the present invention, a solderable ring shaped material 234 is attached to the underside of the lead frame 212. When overmolding the lead frame 212 and the wire bonds 240 to form a protective cover 238, a solderable surface 235 is left clean, so that it can be soldered to a corresponding sealing pattern on the circuit carrier (not shown in FIGS. 16 to 18).

Consequently, the opening 226 which ensures access of the media to be measured to the membrane 208 is sealed at the interface between the lead frame 112 and the circuit carrier. Advantageously, the sealing can be performed in the same step as the soldering of the terminal 222.

A further embodiment of the present invention will now be explained with reference to FIGS. 19 to 23.

FIG. 19 schematically illustrates in a schematic perspective view a sensor system 300 according to a further embodiment of the present invention. FIG. 20 shows a sectional view of the sensor system 300. A sensor arrangement 302 is mounted on a circuit carrier 304. It has to be noted that the circuit carrier 304 again is not part of the sensor arrangement 302 according to the present invention, but is part of the sensor system 300 together with the sensor arrangement 302. In the Figures, the circuit carrier 304 is schematically depicted as a square piece of rigid material in order not to unnecessarily obscure the drawings. However, it is clear to a person skilled in the art that the shown circuit carrier 304 may in reality be only a small segment of a larger entity, for instance a printed circuit board (PCB) or a flexible board, having further electrical leads and electronic components mounted thereon.

FIG. 20 schematically illustrates the sensor arrangement 302 comprising a transducer element 306 which may for instance be a capacitive pressure sensor according to the shown embodiment. Such a capacitive pressure sensor may for instance be fabricated as a ceramic pressure sensor based on how-temperature cofired ceramic (LTCC) technology. LTCC is a three-dimensional ceramic technology for the fabrication of different electronic modules. It is a mixture of thick-film and ceramic technologies. The thick-film technology contributes the lateral and vertical electrical interconnections, and the embedded and surface passive electronic components (resistors, thermistors, inductors, capacitors). The laminate ceramic technology contributes the electrical, mechanical, and dielectric properties as well as different three-dimensional (3D) structures, such as cantilevers, bridges, diaphragms, channels and cavities. Of course, also other techniques, such as high-temperature cofired ceramic (HTCC) technology, thin film on ceramic or glass, or the like can be used.

The transducer element 306 has an active surface 315 which carries electrical connections and the thick film electrodes 319. Advantageously, the opposing surface 317 of the transducer element 306 does not carry any active components, so that a protective cover is not needed.

The transducer element 306 is mounted on a sensor substrate 312 with the active surface 315 being arranged towards the sensor substrate 312. The sensor substrate 312 has a first surface 314 on which the transducer element 306 is mounted. A second surface 316 which is opposite to the first surface 314 is facing towards the circuit carrier 304. The sensor substrate 312 comprises a plurality of electrically conductive leads 318 which are connected selectively to the transducer element 306. In contrast to the previously shown embodiments, however, the first surface 314 does not carry any electrically conductive leads but only at least one side wall 321. Instead, the electrically conductive leads 318 are provided on the transducer element 306.

As this is known in the art, media being present in the measurement volume 110 need to have access to the active surface 315, and in particular the electrodes 319. This is ensured by a media channel 124 which is formed by a first opening 126 penetrating the sensor substrate 312 and a second opening 128 passing through the circuit carrier 304. The first and second openings 126, 128 are aligned concentrically to from a straight channel 124.

According to the present invention, the interface between the sensor substrate 312 and the circuit carrier 304 is sealed around the media channel 124 by means of a solder seal 330. According to certain embodiments of the present invention is formed by a ring-shaped solderable first sealing pattern 332 arranged on the circuit carrier 304 and a ring-shaped solderable second sealing pattern 334 on the sensor substrate, both sealing patterns 332, 334 being soldered together. In the shown embodiment, the sealing patterns 332, 334 have a circular form with essentially the same size and are aligned concentrically with respect to each other and to the media channel 124.

Of course, the sealing patterns 332, 334 do not necessarily have to be circular; they may have also polygonal or elliptic outlines. Moreover, they do not have to have an identical shape and size, and may also be aligned off-center, as long as they encompass the respective first and second openings 126, 128 for forming a soldered seal 330 around these openings.

According to the present invention, the circuit carrier 304 comprises contact pads 336 which each form a solder connection to one of the side wall terminals 322. The idea of the present invention allows to form the sealing connection between the first and second sealing patterns 332, 334 in the same processing step at which the terminals 322 are soldered to the contact pads 336. Thus, a processing step that has to be performed anyway when mounting the sensor substrate to the circuit carrier can additionally be used for establishing a secure sealing of the media channel 124, thereby protecting the contacts from any aggressive media present in the measurement volume 110. Where the sensor substrate comprises at least one corresponding surface mount technology (SMT) terminal which is interconnected to the contact pad 336, the electrical connection between the SMT terminal and the circuit carrier advantageously can be established simultaneously with performing the sealing step. SMT components combined with a reflow soldering technology are particularly easy to be used for the idea according to the present invention. However, the soldered seal according to the present invention can also be used with any other suitable soldering technique, even with overmolded leadframe packages having an opening through the molded housing. In this case the sensor substrate is formed by the overmolded leadframe, the solderable second sealing pattern being arranged at the outside of the housing material. Advantageously, no further sealing materials, such as gaskets or resin, have to be procured when mounting the sensor arrangement 302.

Advantageously, an optional inner seal 346 may be provided between the transducer element 306 and the sensor substrate 312. The inner seal 346 limits the axis of the media to be measured only to those active areas where a contact is allowed.

The soldering step may be performed by a reflow soldering technique. In this case, the circuit carrier 304 is screen printed with a solderable precursor forming the contact pads 336 and the first sealing pattern 332. After the sensor arrangement 302 has been aligned on the circuit carrier 304, so that the solderable side wall terminals 322 are positioned in contact with the contact pads 336 and the first and second sealing patterns 332, 334 are in contact with each other, the sensor system 300 is heated up until the precursor material reaches the liquidus state. After cooling down, the solder connections are established, forming the electrical connections as well as providing a secure sealing against the ingress of humidity and/or aggressive chemicals into the interface between the circuit carrier 304 and the sensor substrate 312.

An additional gasket 152 may seal the underside of the circuit carrier 304. Such a gasket 152 may of course also be useful with the sensor systems which were explained with reference to FIGS. 1 to 18.

Figure 21:
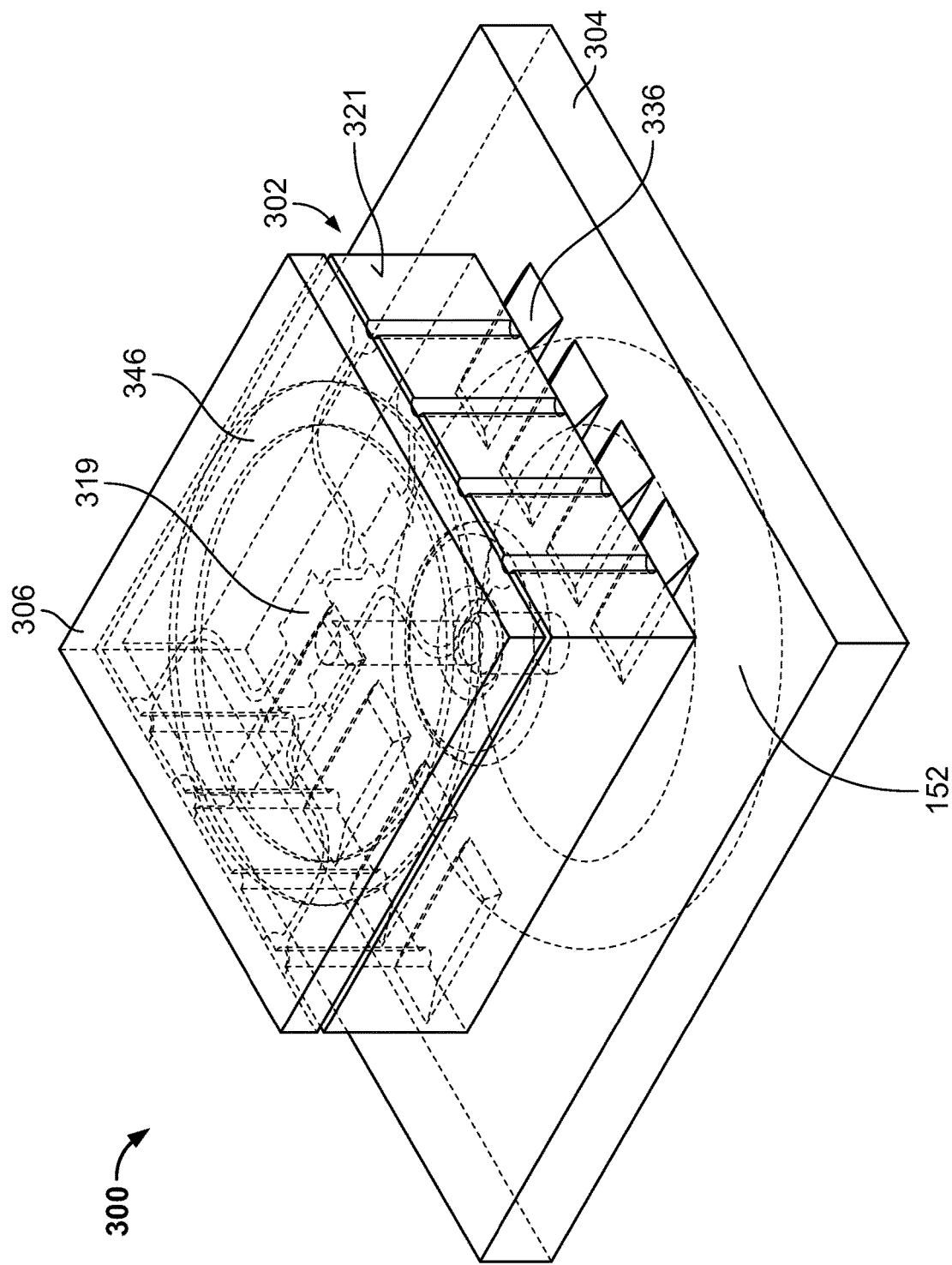
FIG. 21 is another perspective view of the sensor arrangement according to FIG. 19.
Figure 22:
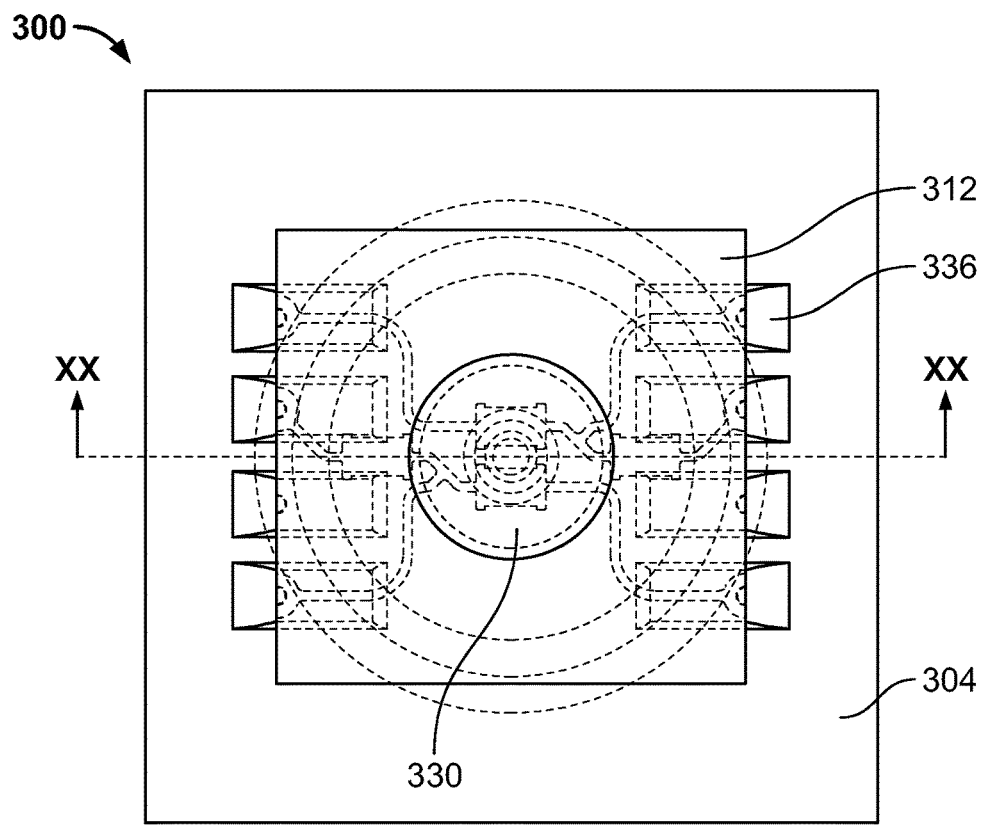
FIG. 22 is a top view of the sensor arrangement according to FIG. 19.
Figure 23:
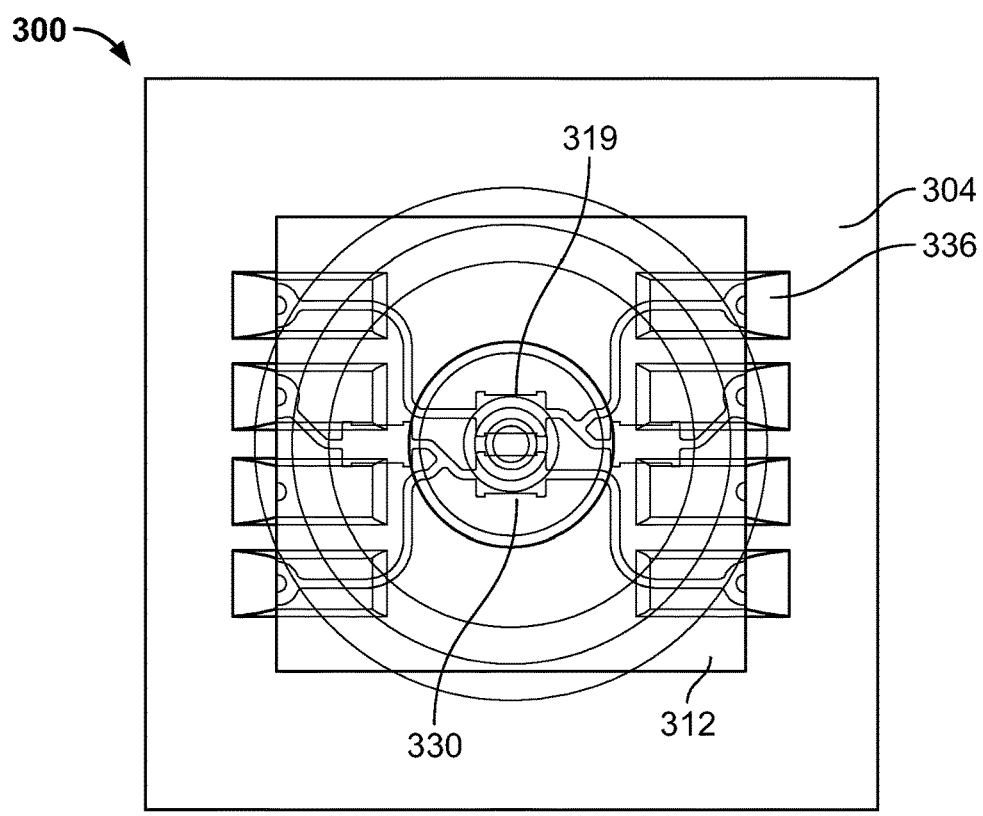
FIG. 23 is another top view of the sensor arrangement according to FIG. 19.
Figure 24:
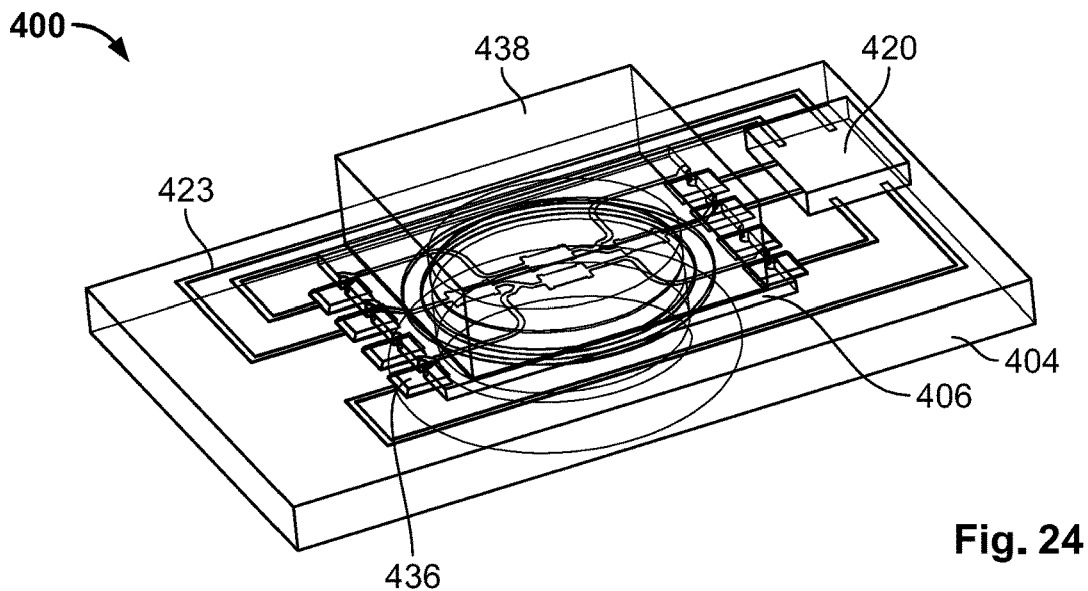
FIG. 24 is a perspective view of a sensor arrangement according to a further embodiment of the present invention.
Figure 25:
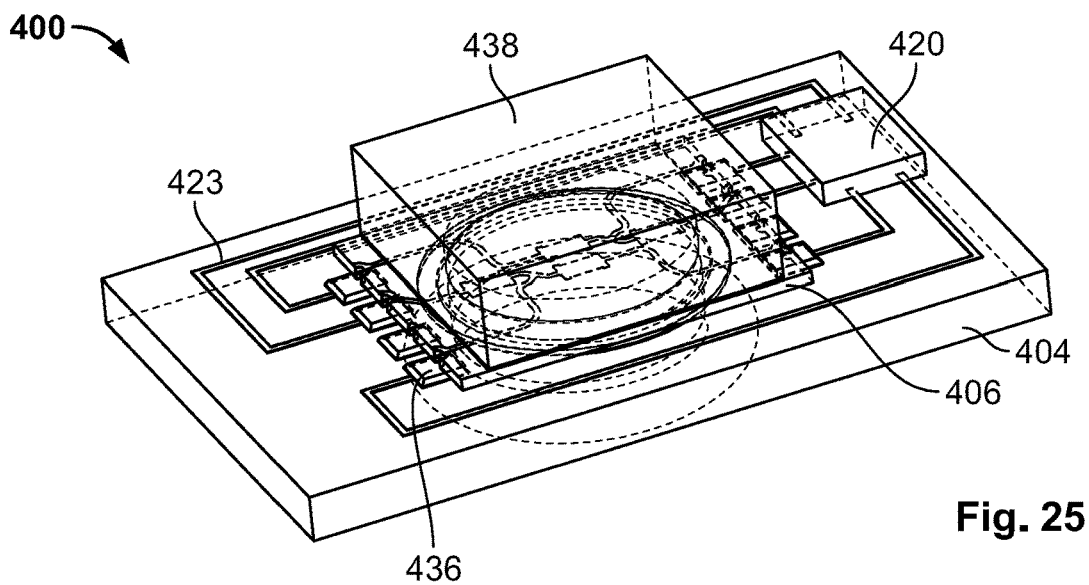
FIG. 25 is another perspective view of the sensor arrangement according to FIG. 24.
Figure 26:
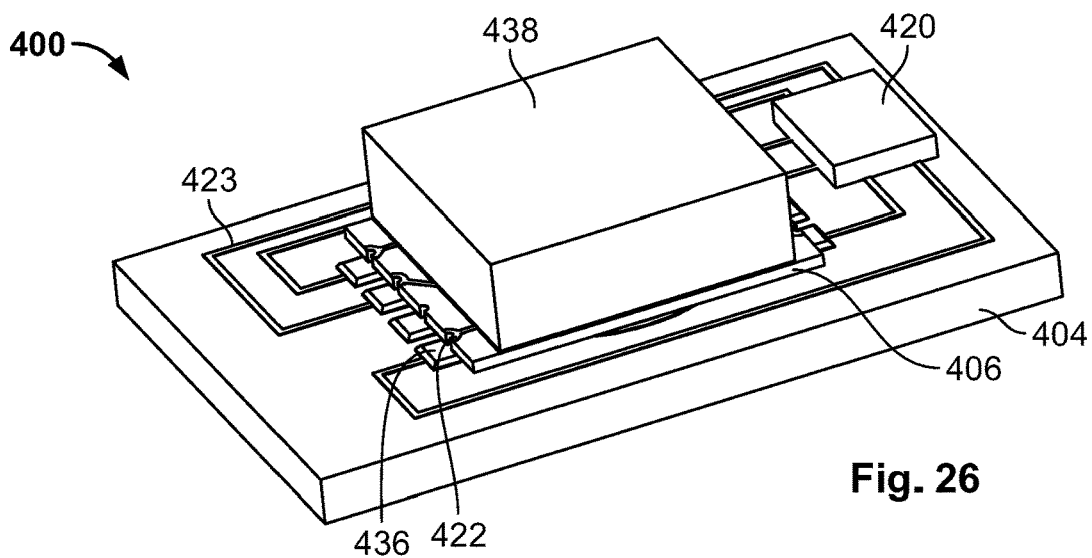
FIG. 26 is another perspective view of the sensor arrangement according to FIG. 24.
Figure 27:
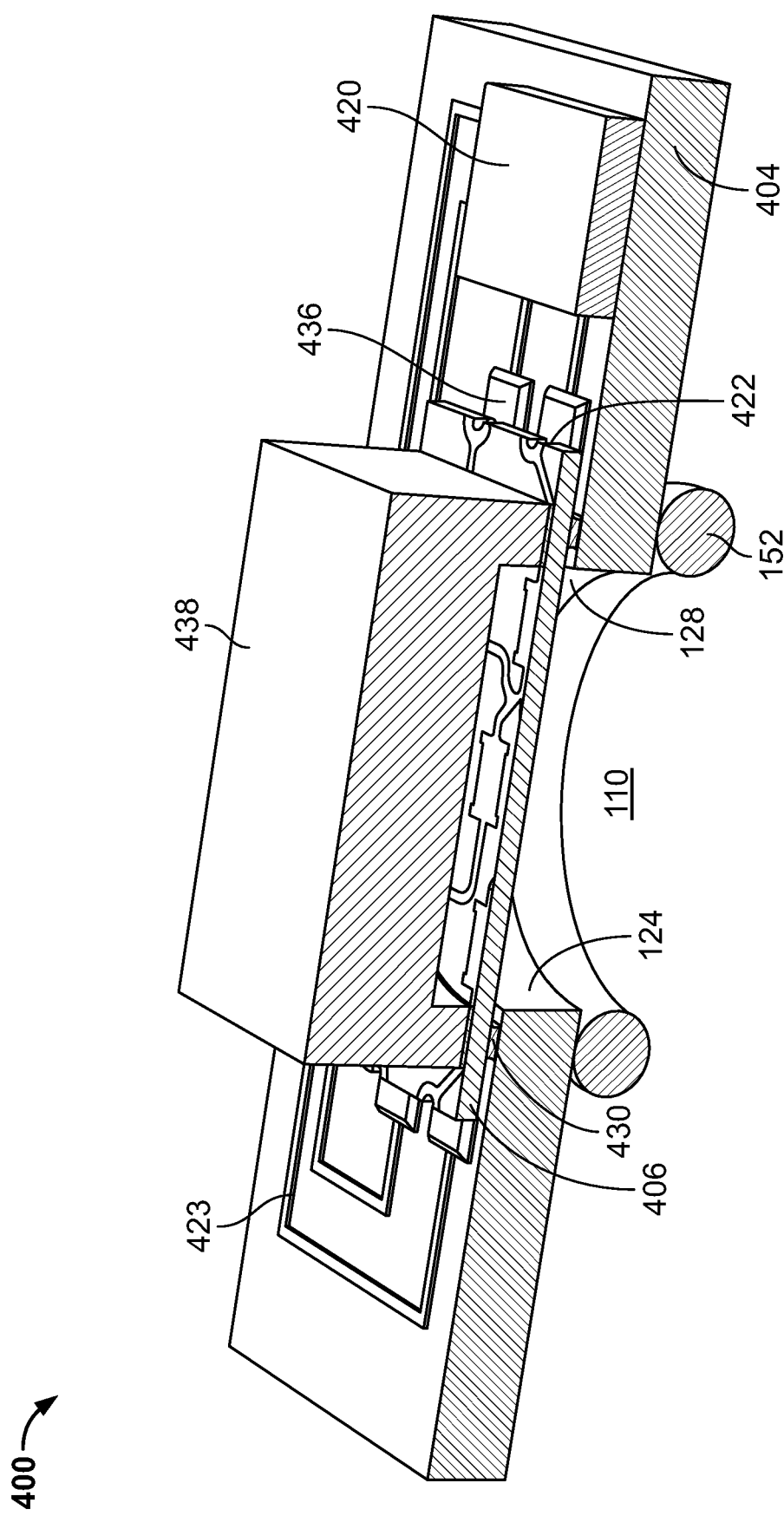
FIG. 27 is a sectional view of the sensor arrangement according to FIG. 24.
Figure 28:
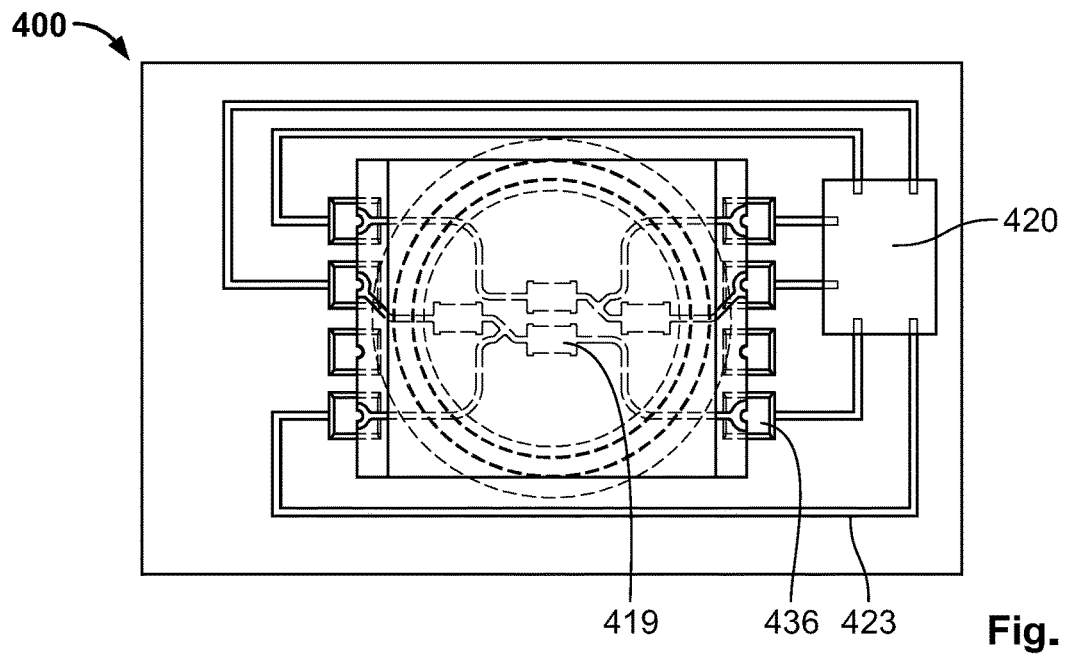
FIG. 28 is a top view of the sensor arrangement according to FIG. 24.
Figure 29:
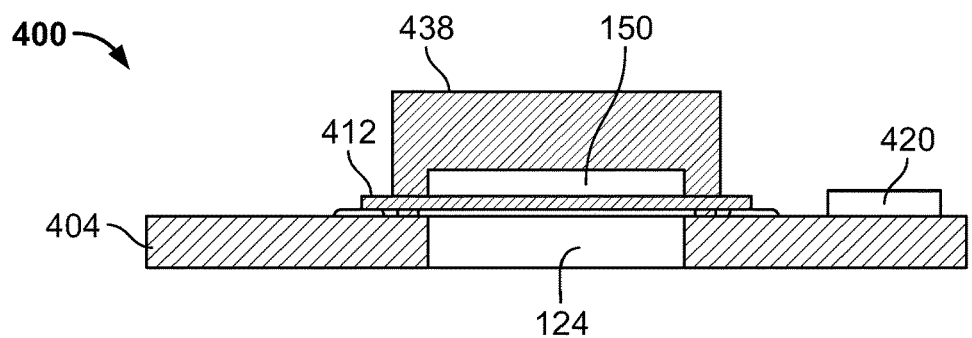
FIG. 29 is another sectional view of the sensor arrangement according to FIG. 24.
Figure 30:
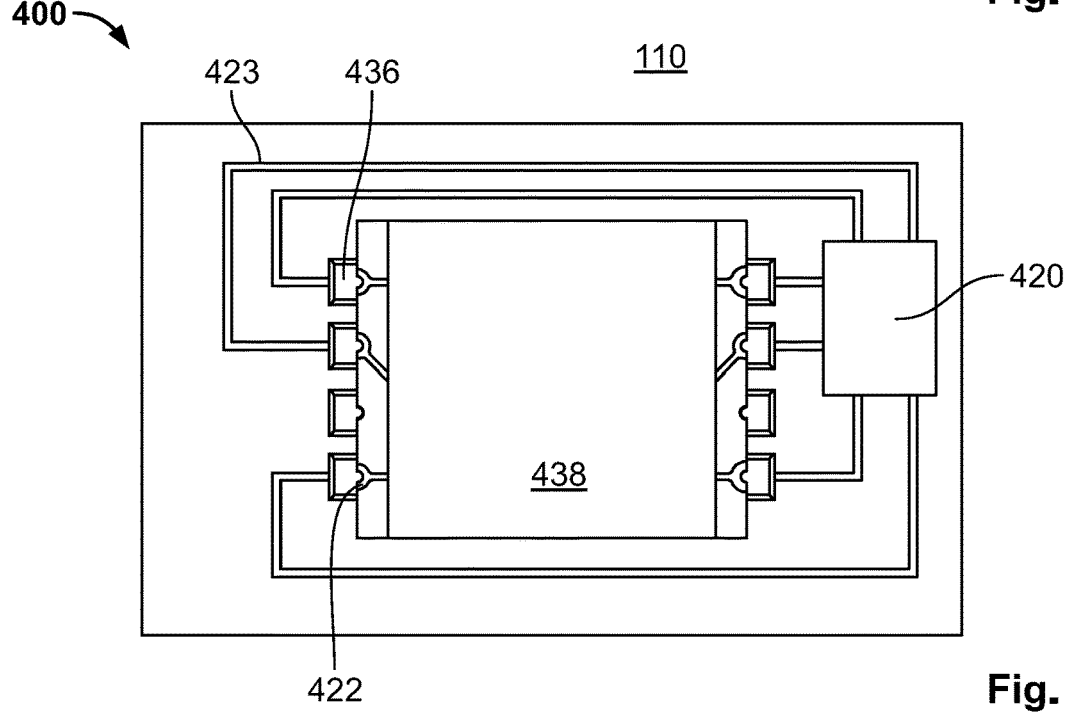
FIG. 30 is another top view of the sensor arrangement according to FIG. 24.
Figure 31:
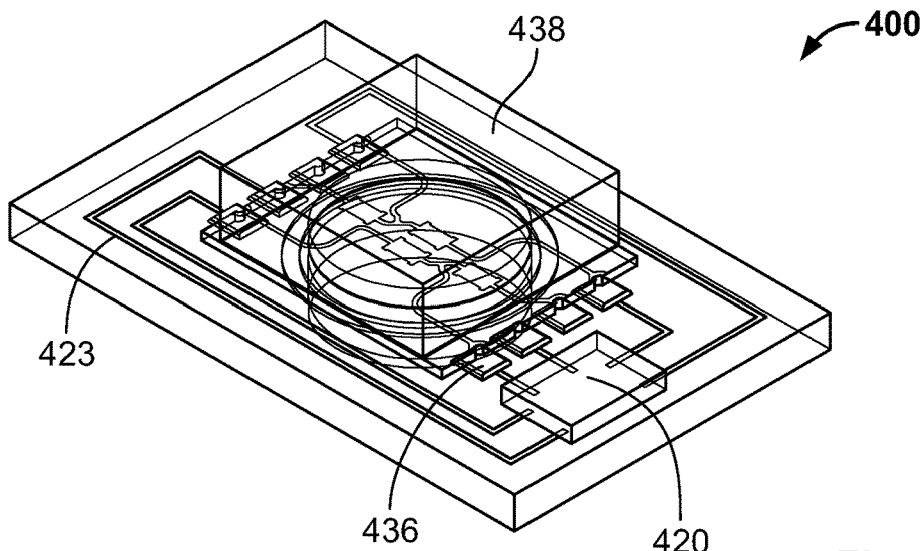
FIG. 31 is another perspective view of the sensor arrangement according to FIG. 24.
Figure 32:
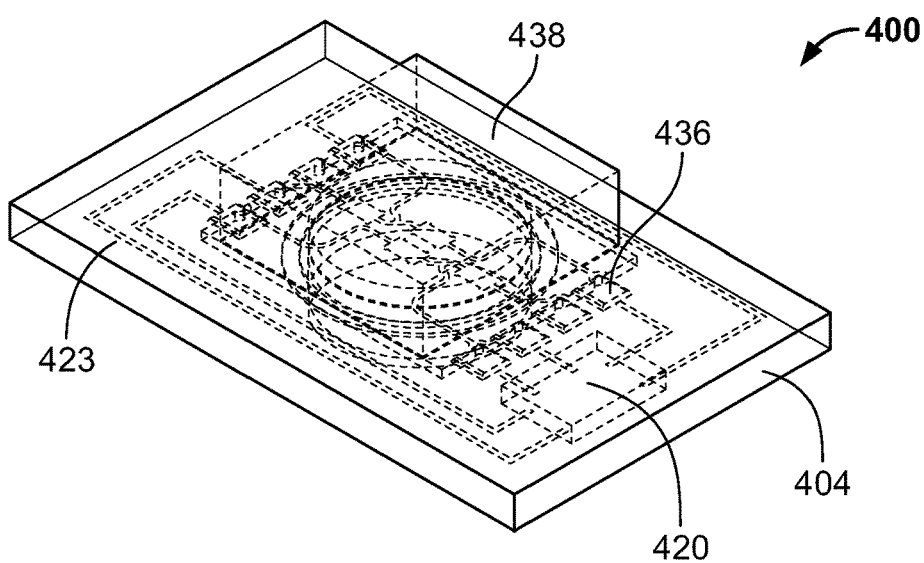
FIG. 32 is another perspective view of the sensor arrangement according to FIG. 24.
Figure 33:
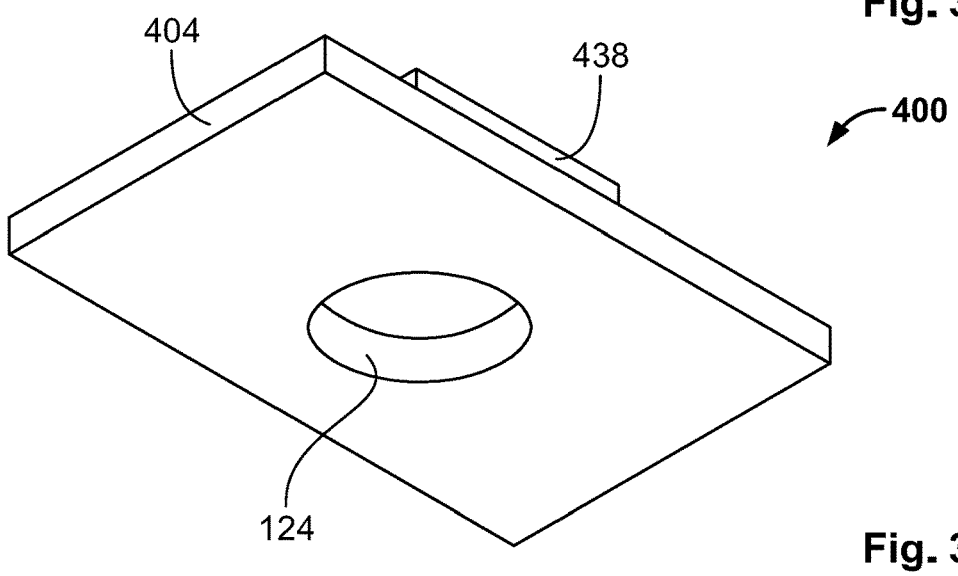
FIG. 33 is another perspective view of the sensor arrangement according to FIG. 24.

FIGS. 21 to 23 illustrate further views of the sensor system 300 depicted in FIG. 19.

Another embodiment of a sensor system 400 will now be explained with reference to the FIGS. 24 to 33.

A sensor arrangement 402 is mounted on a circuit carrier 404. Again, it has to be noted that the circuit carrier 404 is not part of the sensor arrangement 402 according to the present invention, but is part of the sensor system 400 together with the sensor arrangement 402. In the Figures, the circuit carrier 404 is schematically depicted as a square piece of rigid material in order not to unnecessarily obscure the drawings. However, it is clear to a person skilled in the art that the shown circuit carrier 404 may in reality be only a small segment of a larger entity, for instance a printed circuit board (PCB) or a flexible board. Moreover, the circuit carrier does not have to be square, but may have any other suitable polygonal or rounded (e.g. circular, elliptical) contour. As shown in FIGS. 24 to 33, the circuit carrier 404 is provided with electrical leads 423 and at least one electronic component 420 comprising for instance signal processing circuitry and/or communication interfaces.

Furthermore, the transducer element 406 and the further electronic component 420 are electrically connected to each other by the electrically conductive leads 423.

According to this embodiment, the transducer element 406 is formed by a ceramic sensor, for instance an LTCC pressure sensor as explained above for the transducer element 306. In contrast to the previous sensor system 300, however, the sensor arrangement 402 as shown in FIGS. 24 to 33 does not comprise a separate sensor substrate, but uses the LTCC substrate 412 as the substrate according to the present invention. Compared to the previous embodiment explained with reference to FIGS. 19 to 23, the transducer element 406 is mounted on a circuit carrier 404 turned by 180° so that the electrically conductive active surface 415 is oriented away from the circuit carrier 404. Because the transducer element is thin enough to be pressure sensitive towards a pressure difference between its two surfaces as a whole, the transducer element 406 can still monitor a pressure present in the measurement volume 110.

In order to allow access of the media being present in a measurement volume 110 to the transducer element 406, a media channel 124 is formed by an opening 128 passing through the circuit carrier 404.

In order to protect and optionally electrically screen the transducer element 406, a protective cover 438 may be attached to the transducer element 406. Additionally, also further electronic components such as signal processing circuitry and communication interfaces can be covered and/or screened by the protective cover 438. A protective cover 438 is advantageous when wire bonds or the like are present. The protective cover 438 is fabricated from plastics, ceramic, glass, or from an electrically conductive material, such as metal. The protective cover 438 may be fully sealed, e.g. when used with ceramic based absolute pressure sensors. Alternatively, the protective cover 438 may also have one or more openings, e.g. when used with differential or gauge pressure sensors, or for other reasons.

According to the present invention, the interface between the transducer element 406 and the circuit carrier 404 is sealed around the media channel 124 by means of a solder seal 430. According to certain embodiments of the present invention is formed by a ring-shaped solderable first sealing pattern 432 arranged on the circuit carrier 404 and a ring-shaped solderable second sealing pattern 434 arranged on the transducer element 406, both sealing patterns 432, 434 being soldered together. In the shown embodiment, the sealing patterns 432, 434 have a circular form with essentially the same size and are aligned concentrically with respect to each other and to the media channel 124. As mentioned above, the two openings do not necessarily have to be concentric. If they have differing sizes, concentricity is not required, as long as a media channel with a sufficiently large diameter is formed.

Of course, the sealing patterns 432, 434 do not necessarily have to be circular; they may have also polygonal or elliptic outlines. Moreover, they do not have to have an identical shape and size, and may also be aligned off-center, as long as they encompass the opening 128 for forming a soldered seal around this opening.

According to the present invention, the circuit carrier 404 comprises contact pads 436 which each form a solder connection to one of the side wall terminals 422. The idea of the present invention allows to form the sealing connection between the first and second sealing patterns 432, 434 in the same processing step at which the terminals 422 are soldered to the contact pads 436. Thus, a processing step that has to be performed anyway when mounting the sensor substrate to the circuit carrier can additionally be used for establishing a secure sealing of the media channel 124, thereby protecting the electronic components 420 from any aggressive media present in the measurement volume 110. Advantageously, no further sealing materials, such as gaskets or resin, have to be procured.

The soldering step may be performed by a reflow soldering technique. In this case, the circuit carrier 404 is screen printed with a solderable precursor forming the contact pads 436 and the first sealing pattern 432. After the sensor arrangement 402 and the electronic component 420 have been aligned on the circuit carrier 404, so that the solderable terminals 422 are positioned in contact with the contact pads 436 and the first and second sealing patterns 432, 434 are in contact with each other, the sensor system 400 is heated up until the precursor material reaches the liquidus state. After cooling down, the solder connections are established, forming the electrical connections as well as providing a secure sealing against the ingress of humidity and/or aggressive chemicals into the interface between the circuit carrier 404 and the sensor substrate 412 of the transducer element.

An additional gasket 152 may seal the underside of the circuit carrier 404.

FIGS. 28 to 33 show further views of the sensor system 400 depicted in FIGS. 24 to 27, omitting the gasket 152.

The principles of the present invention may advantageously applied to all sensor arrangements where an access of a medium to be monitored has to be provided and, at the same time, sensitive electronic components have to be protected from this medium. For instance, the transducer element may comprise a microelectromechanical system (MEMS) gas sensor and/or a MEMS pressure sensor. Any other sensor arrangements with transducers requiring direct contact with the media to be monitored may of course also profit from the sealing technique according to the present invention.

What is claimed is:

1. A sensor arrangement comprising:
at least one transducer element for monitoring at least one measurand and generating an electrical output signal correlated with the at least one measurand; and
a sensor substrate comprising the transducer element and a terminal;
wherein the sensor substrate is mountable on a circuit carrier in a way that a media channel penetrating the circuit carrier allows access of the at least one measurand to the transducer element;
wherein the circuit carrier has an electrically conductive solderable first sealing pattern which surrounds the media channel at least partly and which is aligned with a solderable second sealing pattern arranged on the sensor substrate, so that a soldered sealing connection comprising only solderable material of each of the first sealing pattern and the second sealing pattern, which at least partly surrounds the media channel, is formed between only the first sealing pattern and the second sealing pattern, the first sealing pattern is a reflow solder material, the circuit carrier has a contact pad interconnected with the terminal, the entirety of the soldered sealing connection is positioned closer to the media channel than the contact pad and the terminal and seals the media channel from the contact pad and the terminal.

2. The sensor arrangement according to claim 1, wherein the sensor substrate has at least one first opening and the circuit carrier has at least one second opening for mounting the sensor substrate in a way that the first and second openings are fluidically connected with each other, the sensor substrate being attached to the circuit carrier with a second surface that is opposed to a first surface whereto the transducer element is mounted; and
wherein the electrically conductive solderable first sealing pattern surrounds the second opening at least partly and is aligned with the solderable second sealing pattern arranged on the second surface of the sensor substrate, so that a soldered sealing connection, which at least partly surrounds the first opening, is formed between the first sealing pattern and the second sealing pattern.

3. The sensor arrangement according to claim 2, wherein the transducer element is at least partly encompassed by a protective cover that is attached to the first surface of the sensor substrate.

4. The sensor arrangement according to claim 3, wherein the protective cover is ring-shaped, and/or wherein the protective cover comprises an overmolded plastic housing, and/or wherein the protective cover comprises a cap-shaped lid.

5. The sensor arrangement according to claim 1, wherein the transducer element comprises a microelectromechanical system (MEMS) gas sensor and/or a MEMS pressure sensor.

6. The sensor arrangement according to claim 1, wherein the sensor substrate comprises a ceramic chip carrier.

7. The sensor arrangement of claim 1, further comprising an inner seal which is arranged at an interface between the sensor substrate and the transducer element, the inner seal at least partly encompassing the transducer element.

8. The sensor arrangement of claim 7, wherein the inner seal is formed from a silicon resin.

9. A method of assembling a sensor system, the method comprising the steps of:
providing at least one transducer element, which is operable to monitor at least one measurand and to generate an electrical output signal correlated with the at least one measurand, wherein
(a) the transducer element forms a sensor substrate, or
(b) wherein the transducer element is mounted on a first surface of a sensor substrate, which has at least one first opening through which the measurand has access to the transducer element;
providing a circuit carrier for mounting the sensor substrate, the circuit carrier having a contact pad, at least one second opening, and an electrically conductive solderable first sealing pattern which surrounds the at least one second opening at least partly, the first sealing pattern is a reflow solder material;
aligning the circuit carrier with the sensor substrate in a way that access of the at least one measurand to the transducer element is allowed through a media channel penetrating the circuit carrier and being formed of at least the second opening, and that the electrically conductive solderable first sealing pattern is aligned with a solderable second sealing pattern arranged on the sensor substrate and the contact pad is aligned with a terminal arranged on the sensor substrate;
performing a soldering step so that a soldered sealing connection comprising only solderable material of each of the first sealing pattern and the second sealing pattern, which at least partly surrounds the media channel, is formed between only the first sealing pattern and the second sealing pattern, the entirety of the soldered sealing connection is positioned closer to the media channel than the contact pad and the terminal and seals the media channel from the contact pad and the terminal.

10. The method according to claim 9, wherein the soldering step comprises heating the sensor arrangement, so that the first sealing pattern is liquefied.

11. The method according to claim 9, further comprising the step of electrically connecting the transducer element to an electronic component arranged on the sensor substrate and/or
further comprising the step of attaching a protective cover so that it encompasses the transducer element at least partly.

12. The method according to claim 11, wherein the transducer element is connected to the electronic component by means of at least one wire bond connection and/or at least one conductive trace arranged on the sensor substrate.

13. The method according to claim 9, wherein during the soldering step an electrically conductive connection is formed between the contact pad and the terminal.

* * * * *